(12) United States Patent
Hayashi

(10) Patent No.: US 8,358,339 B2
(45) Date of Patent: Jan. 22, 2013

(54) TESTING METHOD, TESTING AND PROCESSING SYSTEM, PROCESSING DEVICE, TESTING DEVICE, MANUFACTURING/TESTING DEVICE, AND MANUFACTURING/TESTING METHOD

(75) Inventor: Kenta Hayashi, Tokyo (JP)

(73) Assignee: Dai Nippon Printing Co., Ltd, Tokyo (JP)

( * ) Notice: Subject to any disclaimer, the term of this patent is extended or adjusted under 35 U.S.C. 154(b) by 1029 days.

(21) Appl. No.: 12/373,350

(22) PCT Filed: Jul. 25, 2007

(86) PCT No.: PCT/JP2007/064549
§ 371 (c)(1),
(2), (4) Date: Jan. 12, 2009

(87) PCT Pub. No.: WO2008/013188
PCT Pub. Date: Jan. 31, 2008

(65) Prior Publication Data
US 2009/0309965 A1    Dec. 17, 2009

(30) Foreign Application Priority Data

| Jul. 27, 2006 | (JP) | 2006-205080 |
| Jul. 28, 2006 | (JP) | 2006-206968 |
| Jul. 31, 2006 | (JP) | 2006-208778 |

(51) Int. Cl.
*H04N 7/18* (2006.01)
*H04N 9/47* (2006.01)

(52) U.S. Cl. .............. 348/86; 348/87; 348/92; 348/125; 348/126

(58) Field of Classification Search .................... 348/86, 348/87, 92, 125, 126; 700/110
See application file for complete search history.

(56) References Cited

U.S. PATENT DOCUMENTS

| 5,951,229 A * | 9/1999 | Hammerslag ................ 414/398 |
| 2008/0267446 A1 * | 10/2008 | Capewell ..................... 382/100 |

FOREIGN PATENT DOCUMENTS

| JP | 5-172542 | 7/1993 |
| JP | 2002-139452 | 5/2002 |
| JP | 2005-61953 | 3/2005 |
| JP | 2006-153605 | 6/2006 |

* cited by examiner

Primary Examiner — Aaron Strange
(74) Attorney, Agent, or Firm — Young & Thompson

(57) ABSTRACT

An inspecting method for grasping the inspection result on an intermediate (or an n-th) treatment without long extension of time, in case predetermined treatments of a predetermined number (N times) are exerted on a plurality of sheets running on a conveyor line, before all the treatments of N-times are ended. The inspecting method for inspecting an object subjected to the predetermined treatment includes performing the predetermined treatment repeatedly by the N-times (N: a natural number of 2 or more) sequentially on the individual objects being conveyed on the conveyor line, and an inspecting step of testing such a leading one of the objects as has been subjected to the n-th (n: a natural number of 1 or more but N or less) treatment, and returning the tested object to after such one of the targets as was subjected to the n-th treatment.

10 Claims, 20 Drawing Sheets

IMAGE CAPTURE WIDTH REGION
OF SHEET 100a

IMAGE CAPTURE WIDTH REGION
OF SHEET 100b

IMAGE CAPTURE WIDTH REGION
OF SHEET 100c

IMAGE CAPTURE WIDTH REGION
OF SHEET 100d

IMAGE CAPTURE WIDTH REGION
OF SHEET 100e

TESTING METHOD, TESTING AND PROCESSING SYSTEM, PROCESSING DEVICE, TESTING DEVICE, MANUFACTURING/TESTING DEVICE, AND MANUFACTURING/TESTING METHOD

FIELD OF THE INVENTION

The present invention relates to a testing method and the likes for conducting a test while transporting test objects on a conveyor line.

BACKGROUND OF THE INVENTION

In recent years, buildup printed wiring boards according to $B^2$it (Buried Bump Interconnection Technology/B-square-it) are being developed as the printed wiring boards for high-density packaging. A buildup printed wiring board according to $B^2$it may be produced by stacking copper-foil substrates called "sheets" each having a large number of conical "bumps" formed thereon.

After the formation of the bumps on such a buildup wiring board according to $B^2$it, a test needs to be conducted with an image pickup camera to determine whether or not each of the bumps has a predetermined shape and size and is located in a predetermined position on the sheet. To conduct such a test on the bumps, a technique of measuring the height of each protrusion formed on a work surface can be utilized, as disclosed in Patent Reference 1.

The sheets may have a large standardized size, and some sheets are larger than the image size that can be captured by a camera. To conduct a test on such sheets with high precision in a short period of time, a number of cameras are required. For example, in a case where each sheet is 1000 mm in the test width direction, and the image capture width that can be captured by one camera is 20 mm, fifty cameras are required to conduct a test on one sheet.

To counter this problem, the applicant of this application filed an application for a patent on a method for conducting a test on a large-size test object with a minimum number of CCD cameras (Patent Reference 2).

Meanwhile, in the case of test objects such as the above-mentioned buildup printed wiring boards, it is essential to conduct a test to determine whether each of the bumps has a predetermined shape and is located in a predetermined position with high precision. Therefore, it is necessary to perform precise positioning (or to establish alignment) between the position of the camera and the position of the sheet having the bumps formed thereon.

Patent Reference 1: Japanese Patent Application Publication No. 2005-61953
Patent Reference 2: Japanese Patent Application Publication No. 2006-1553605

DISCLOSURE OF THE INVENTION

Problems to be Solved by the Invention

When bumps are formed on a sheet, silver paste is printed several times on each of the positions on which the bumps are to be formed.

After the silver paste printing is performed several times, the sheet is pulled out, and a test is conducted on the bumps. If a defect such as displacement of a bump occurs during the first time printing, the second time printing and the later printing are performed, with the defect remaining on the sheet.

Normally, printing and drying are repeatedly performed, while sheets are being transported on a conveyor line. However, if the result of the test conducted on the first sheet is not good due to a plate defect such as clogging in the plate, the results of tests conducted on the other sheets being transported on the conveyor line are not good either, and a large number of sheets are wasted (discarded).

In the structure disclosed in Japanese Patent Application Publication No. 2006-153605, more than one camera is still required, and a test on an entire sheet cannot be conducted with one camera.

On the other hand, in the case of test objects such as the above-mentioned buildup printed wiring boards, highly precise positioning also needs to be performed in the manufacturing process (the procedures to be carried out prior to the testing procedures), as in the testing process. As a result, the positioning in the manufacturing process and the positioning in the testing process are both performed on each one test object in conventional cases.

Therefore, the manufacturing period becomes longer by the amount of time required for the two time positioning. As a result, serious disadvantages such as low efficiency, high production costs, and a large manpower requirement are caused.

The present invention has been made in view of the above problematic circumstances, and the first object thereof is to provide a testing method and the likes that are utilized in a case where predetermined processing is performed predetermined times (N times) on sheets that are being transported on a conveyor line. By this method, the results of a test conducted to check a halfway point in the processing (the nth time processing) can be obtained before all the N time processing is completed, without a large extension of time.

The second object of the present invention is to provide a testing method and the likes that are utilized in a case where a test is conducted on test objects such as sheet substrates each having a test area larger than the image size that can be captured by a camera, while the test objects are being transported. By this method, a test on the entire test area of the test objects can be conducted by one camera.

The third object of the present invention is to provide a manufacturing/testing device and a manufacturing/testing method that can eliminate disadvantages in manufacture by reducing the number of times positioning is performed in a case where a manufacturing step and a testing step are carried out on the same structure.

Means to Solve the Problems

The invention described herein to solve the above problems is a testing method for conducting tests on objects on which predetermined processing is performed. This testing method is characterized by including: a processing step of repeatedly performing the predetermined processing on the objects N times (N being a natural number of 2 or larger) in a sequential manner, while the objects are being transported on a conveyor line; and a testing step of conducting a test on the first one of the plurality of the objects having the nth time processing (n being a natural number of one or larger to N or smaller) first performed thereon, and returning the tested first object to a spot behind one of the other objects having the nth time processing completed thereon.

In accordance with this invention, where N time predetermined processing is performed on each of the objects being transported, a test is conducted on the first object having the nth time processing completed thereon, and the tested first object is returned to a spot behind one of the other objects having the nth time processing completed thereon. Accordingly, the result of the test conducted to check a halfway point in the processing (the nth time processing) can be obtained before all the N time processing is completed, without a large extension of time.

The invention described herein to solve the above problems is the testing method as described above, characterized in that the testing step includes returning the tested object to a spot after the last object having the nth time processing last performed thereon.

In accordance with this invention, the tested object is properly returned onto the conveyor line, and the predetermined processing can be continued on the tested object.

The invention described herein to solve the above problems is the testing method as described above, characterized in that: the testing step includes a test result notifying step of notifying the processing step of the result of the test conducted on the objects having the nth time processing completed thereon; and the processing step includes receiving the notification of the result of the test conducted to check the nth time processing from the testing step, and, when the test result is not good, stopping the processing being performed on the objects.

In accordance with this invention, the processing is stopped if the test result is not good. Accordingly, the test result can be promptly reflected in the processing being performed on the other objects.

The invention described herein to solve the above problems is the testing method as described above, characterized in that: the testing step includes a test result notifying step of notifying the processing step of the result of the test conducted on the objects having the nth time processing completed thereon; and the processing step includes receiving the notification of the result of the test conducted to check the nth time processing from the testing step, and, only when the test result is good, performing the (n+1)th time processing on the objects.

In accordance with this invention, after the result of a test conducted to check the nth time processing is received, the next time ((n+1)th time) test is conducted. Accordingly, the test to check the nth time processing can be completed before the next time ((n+1)th time) processing is performed. Thus, the result of the test to check the nth time processing can be promptly fed back to the next time processing, and unnecessary processing is minimized.

The invention described herein to solve the above problems is the testing method as described above, characterized in that: the objects are sheet substrates; the predetermined processing in the processing step is printing processing performed by repeatedly printing silver paste on the sheet substrates, to form bumps with a predetermined height on the sheet substrates; and the testing step includes checking whether each of the bumps exists properly, has the predetermined height, and is located in a predetermined position.

In accordance with this invention, where N time predetermined printing is performed on each of the plurality of the sheet substrates being transported, a test is conducted on the first sheet substrate having the nth time printing completed thereon, and the tested first sheet substrate is returned to a spot behind one of the other sheet substrates having the nth time printing completed thereon. Accordingly, the result of the test conducted to check a halfway point in the printing (the nth time printing) can be obtained before all the N time printing is completed.

The invention described herein to solve the above problems is a testing method for conducting tests on test objects each having a test area larger than an image size that can be captured by a camera, while the test objects are being transported on a conveyor line. This testing method is characterized by including: an image capturing step of capturing an image of the image capture width region of one of the test objects, the image capture width region being equivalent to the image size that can be captured by the camera, the image capturing step including a moving step of moving the camera by the distance equal to or lager than the image capture width every time image capturing is completed, images of image capture width regions excluding the region corresponding to the image capture width region of the one of the test objects being captured from other test objects transported to the image capturing step after the camera is moved, the moving of the camera and the image capturing being repeated until the entire test area of the test objects is captured, the image capturing being performed on image capture width regions that do not overlap with one another of the test objects among all the test objects; and a testing step of conducting a test on the entire test area of the test objects by obtaining, from the camera, the images of the respective image capture width regions captured in the image capturing step.

In accordance with this invention, where a test is conducted on test objects such as a plurality of sheet substrates each having a test area larger than the image size that can be captured by a camera while the test objects are being transported, the camera is moved to capture an image of each of the image capture regions that do not overlap with one another in the test objects transported to the image capturing step. In this manner, a test on the entire test area of the test objects can be conducted with one camera.

The invention described herein to solve the above problems is the testing method as described above characterized in that: the moving step includes moving the camera only by the distance equivalent to the image capture width; and the image capturing step includes capturing an image of an image capture width region adjacent to the region corresponding to the image capture width region of the one of the test objects, the captured image of the image capture width region being of the test object transported immediately behind the one of the test objects, after the camera is moved.

In accordance with this invention, the movement of the camera can be reduced to the minimum amount, and the image capture error or the like caused by a physical movement error can also be reduced to the minimum amount.

The invention described herein to solve the above problems is the testing method as described above, characterized in that: the testing method is a method for conducting tests on the test objects each having predetermined processing completed thereon; the testing method further includes a processing step of performing the predetermined processing on each of the test objects in a sequential manner, while the plurality of the test objects are being transported on the conveyor line; and the image capturing step includes completing image capturing on all the test objects that need to have the image capture width regions captured to obtain an image of the entire test area of the test objects among all the test objects, before the predetermined processing on all the test objects is completed.

In accordance with this invention, the test result can be promptly reflected in the processing.

The invention described herein to solve the above problems is the testing method as described above, characterized in that: the processing step includes repeatedly performing the predetermined processing on each of the test objects; the image capturing step includes completing image capturing on all the test objects that need to have the image capture width regions captured to obtain the image of the entire test area of the test objects among all the test objects, before the nth time processing (n being a natural number) on all the test objects is completed; and the testing step includes conducting a test on the entire test area after the nth time processing, by obtaining, from the camera, the images of the respective image capture width regions captured in the image capturing step.

In accordance with this invention, the test result can be certainly reflected in the (n+1)th time processing and the later processing.

The invention described herein to solve the above problems is the testing method as described above, characterized in that: the testing step includes a test result notifying step of notifying the processing step of a test result; and the processing step includes stopping the processing, when the notification indicates that the test result is not good.

In accordance with this invention, the processing is stopped, if the test result is not good. Accordingly, the test result can be promptly reflected in the next time processing and the processing to be performed on the other test objects.

The invention described herein to solve the above problems is the testing method as described above characterized in that: the test objects are sheet substrates; the predetermined processing in the processing step is printing processing performed by printing silver paste on the sheet substrates, to form bumps with a predetermined height on the sheet substrates; and the testing step includes checking whether each of the bumps has the predetermined height, exists properly, and is located in a predetermined position.

In accordance with this invention, where a test to check whether each of the bumps formed on the sheet substrates has the predetermined height, exists properly, and is located in the predetermined position while the sheet substrates each having a larger test area than the image size that can be captured by a camera are being transported, the camera is moved to capture an image of each of the image capture regions that do not overlap with one another in the sheet substrates transported to the image capturing step. In this manner, a test on the entire test area of the test objects can be conducted with one camera.

The invention described herein to solve the above problems is a manufacturing/testing device that has a manufacturing unit that forms a structural component on a material being transported by a transporting unit such as transportation path, and a testing unit that conducts an appearance test to check the form of the structural component. This manufacturing/testing device is characterized by including: a positioning unit that performs positioning among the position of the material, the position of the transporting unit, and the position of the manufacturing unit; and a supporting unit that supports the testing unit. The manufacturing unit forms the structural component on the material being transported by the transporting unit having the positioning performed thereon. The manufacturing/testing device further includes a base that has the supporting unit and the transporting unit fixed thereto.

In accordance with this invention, the testing unit conducts a test to check the appearance of the formed structural component while the adjusted positions of the manufacturing unit and the transporting unit are maintained, and the supporting unit that supports the testing unit is fixed onto the base onto which the transporting unit is also fixed. Accordingly, a fixed positional relationship is maintained between the transporting unit for transporting the material and the testing unit having the positioning performed thereon. Thus, there is no need to perform positioning in any direction other than the transporting direction between the structural component and the testing unit before the appearance test is conducted on the structural component.

The invention described herein to solve the above problems is the manufacturing/testing device as described above characterized in that the supporting unit supports the testing unit while moving the testing unit in a direction perpendicular to the direction in which the transporting unit transports the material having the structural component formed thereon, when the test on the structural component is conducted.

In accordance with this invention, the supporting unit supports the testing unit while moving the testing unit in the direction perpendicular to the direction in which the transporting unit transports the material. Accordingly, even in a case where the structure of the testing unit is simplified as each test is conducted while the testing unit is being moved in the transporting direction, there is no need to perform positioning in any direction other than the transporting direction between the structural component and the testing unit before the appearance test is conducted.

The invention described herein to solve the above problems is a manufacturing/testing device that has a manufacturing unit that forms a structural component on a material being transported by a transporting unit such as transportation path, and a testing unit that conducts an appearance test to check the form of the structural component. This manufacturing/testing device is characterized by including a positioning unit that performs positioning among the position of the material, the position of the transporting unit, and the position of the manufacturing unit. The manufacturing unit forms the structural component on the material being transported by the transporting unit having the positioning performed thereon. The manufacturing/testing device further includes a base that has the testing unit and the transporting unit fixed thereto.

In accordance with this invention, the testing unit conducts a test to check the appearance of the formed structural component while the adjusted positions of the manufacturing unit and the transporting unit are maintained, and the testing unit is fixed onto the base onto which the transporting unit is also fixed. Accordingly, a fixed positional relationship is maintained between the transporting unit for transporting the material and the testing unit having the positioning performed thereon. Thus, there is no need to perform positioning in any direction other than the transporting direction between the structural component and the testing unit before the appearance test is conducted on the structural component.

The invention described herein to solve the above problems is the manufacturing/testing device as described above, characterized in that the positioning unit such as biaxial table is a two-dimensional positioning unit that performs the positioning among the position of the material, the position of the transporting unit, and the position of the manufacturing unit in a plane including the direction in which the material is transported.

In accordance with this invention, the positioning unit is a two-dimensional positioning unit that performs positioning in a plane including the direction in which the material is transported. Accordingly, only the positioning in the transporting direction needs to be performed between the structural component and the testing unit before the appearance test is conducted to check the structural component, and any other two-dimensional positioning is unnecessary.

The invention described herein to solve the above problems is a manufacturing/testing method using the manufacturing/testing device as described above. This manufacturing/testing method includes: a positioning step of performing the positioning by the positioning unit; a forming step of forming the structural component on the material by the manufacturing unit, the material having the positioning performed thereon; and a testing step of conducting an appearance test by the testing unit to check the form of the structural component formed on the material having the positioning performed thereon.

In accordance with this invention, an appearance test is conducted on the structural component formed on the material being transported, while the adjusted positions of the manufacturing unit and the transporting unit are maintained. Accordingly, a fixed positional relationship is maintained between the transporting unit for transporting the material and the testing unit having the positioning performed thereon. Thus, there is no need to perform positioning in any direction other than the transporting direction between the structural component and the testing unit before the appearance test is conducted on the structural component.

Effects of the Invention

In accordance with the present invention, where N time predetermined processing is performed on each of the objects such as sheet substrates being transported, a test is conducted on the first object having the nth time processing performed thereon, and the tested first object is returned to a spot behind one of the other objects having the nth time processing completed thereon. Accordingly, the result of the test conducted to check a halfway point in the processing (the nth time processing) can be obtained before all the N time processing is completed, without a large extension of time.

In accordance with the present invention, where a test is conducted on test objects such as sheet substrates each having a test area larger than the image size that can be captured by a camera while the test objects are being transported, the camera is moved to capture an image of each of the image capture regions that do not overlap with one another with respect to the test objects being transported. In this manner, a test on the entire test area of the test objects can be conducted with one camera, and a common defect among all the test objects can be detected, for example.

Further, in accordance with the invention described herein, the testing unit conducts a test to check the appearance of the formed structural component while the adjusted positions of the manufacturing unit and the transporting unit are maintained, and the supporting unit that supports the testing unit is fixed onto the base onto which the transporting unit is also fixed. Accordingly, a fixed positional relationship is maintained between the transporting unit for transporting the material and the testing unit having the positioning performed thereon. Thus, there is no need to perform positioning in any direction other than the transporting direction between the structural component and the testing unit before the appearance test is conducted on the structural component.

Since the positioning before an appearance test is unnecessary, it is possible to avoid all disadvantages that can be caused by an extension of the manufacturing time, such as low efficiency, high production costs, and a large manpower requirement.

In accordance with the invention described herein, the following effects as well as the same effects as those of the invention described above are achieved. The supporting unit supports the testing unit while moving the testing unit in the direction perpendicular to the direction in which the transporting unit transports the material. Accordingly, even in a case where the structure of the testing unit is simplified as each test is conducted while the testing unit is being moved in the transporting direction, there is no need to perform positioning in any direction other than the transporting direction between the structural component and the testing unit before the appearance test is conducted.

In accordance with the invention described herein, the testing unit conducts a test to check the appearance of the formed structural component while the adjusted positions of the manufacturing unit and the transporting unit are maintained, and the testing unit is fixed onto the base onto which the transporting unit is also fixed. Accordingly, a fixed positional relationship is maintained between the transporting unit for transporting the material and the testing unit having the positioning performed thereon. Thus, there is no need to perform positioning in any direction other than the transporting direction between the structural component and the testing unit before the appearance test is conducted on the structural component.

Since the positioning before an appearance test is unnecessary, it is possible to avoid all disadvantages that can be caused by an extension of the manufacturing time, such as low efficiency, high production costs, and a large manpower requirement.

In accordance with the invention described herein, the following effects as well as the same effects as those of the invention described above are achieved. The positioning unit is a two-dimensional positioning unit that performs positioning in a plane including the direction in which the material is transported. Accordingly, only the positioning in the transporting direction needs to be performed between the structural component and the testing unit before the appearance test is conducted to check the structural component, and any other two-dimensional positioning is unnecessary.

In accordance with the invention described herein, an appearance test is conducted on the structural component formed on the material being transported, while the adjusted positions of the manufacturing unit and the transporting unit are maintained. Accordingly, a fixed positional relationship is maintained between the transporting unit for transporting the material and the testing unit having the positioning performed thereon. Thus, there is no need to perform positioning in any direction other than the transporting direction between the structural component and the testing unit before the appearance test is conducted on the structural component.

Since the positioning before an appearance test is unnecessary, it is possible to avoid all disadvantages that can be caused by an extension of the manufacturing time, such as low efficiency, high production costs, and a large manpower requirement.

Figure 1:
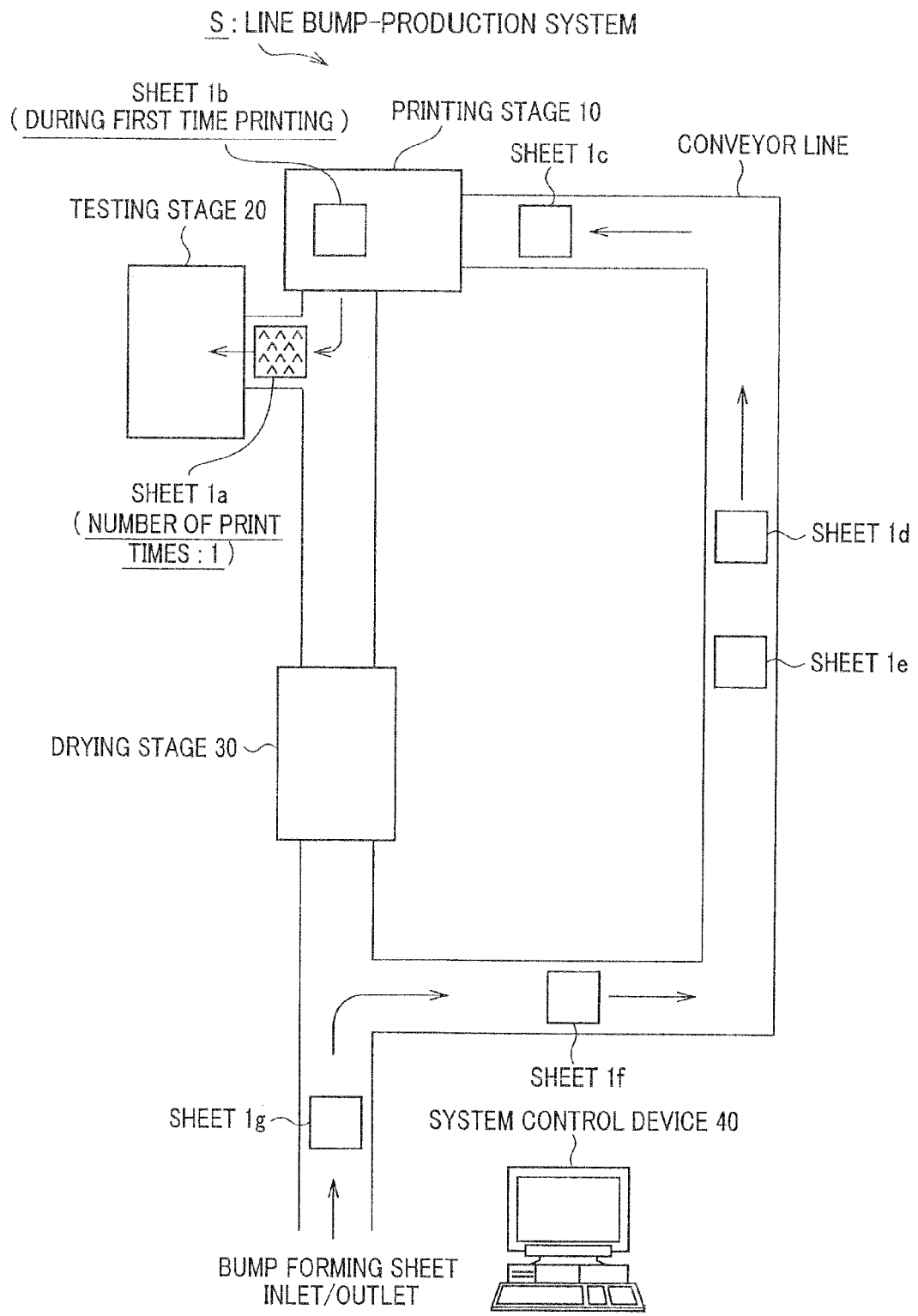
FIG. 1 is an external configuration diagram of a line bump-production system S in accordance with a first embodiment of the present invention.

EXPLANATION OF REFERENCE NUMERALS 1 (1a through 1p), 100 (100a through 100p) sheet
10 printing stage
20 testing stage
30 drying stage
40, 140 system control device
110 printing device
120 testing device
121 line sensor camera
130 drying device
200 base
200A positioning section
200B forming section
200C testing section
201 biaxial table
202 transportation path
203 appearance testing cameras
204 screen printing plate
205 positioning camera
206 rotating table
207 supporting unit
M substrate

BEST MODE FOR CARRYING OUT THE INVENTION (I) First Embodiment

The following is a description of preferred embodiments of the present invention, with reference to the accompanying drawings. The first embodiment concerns a case where a testing method of the present invention is applied in a line bump-production system for forming bumps on sheet substrates while the sheet substrates are being transported.

FIGS. 1 through 5 are external configuration diagrams of a line bump-production system S in accordance with the first embodiment.

The line bump-production system S includes: a printing stage 10 (an example of the processing step of the present invention) that prints silver paste onto sheet substrates 1 (1a through 1h) ("sheet substrates" will be hereinafter referred to simply as "sheets") as an example of objects; a testing stage 20 that conducts tests to check whether each of the bumps exists properly, has a predetermined height, and is located in a predetermined position; a drying stage 30 that performs preliminary drying on the printed silver paste; and a system control device 40 that exchanges information with the computers (not shown) in the printing stage 10, the testing stage 20, and the drying stage 30, and transmits a control signal to each of the computers. The drying stage 30 may be placed before the testing stage 20. Alternatively, the drying stage 30 may not be provided in this system S, and each sheet 1 may be dried after being discharged from this system S. Further, some other processing stage may be provided as well as the printing stage 10 in this system S.

The sheets 1 may be copper-foil sheet substrates that are used as buildup printed wiring boards for the high-density packaging according to $B^2$it or the like, for example. The sheets 1 are sequentially injected into the system S from a bump forming sheet inlet/outlet. Each of the sheets 1 injected into the system S is transported on a conveyor line.

Figure 2:
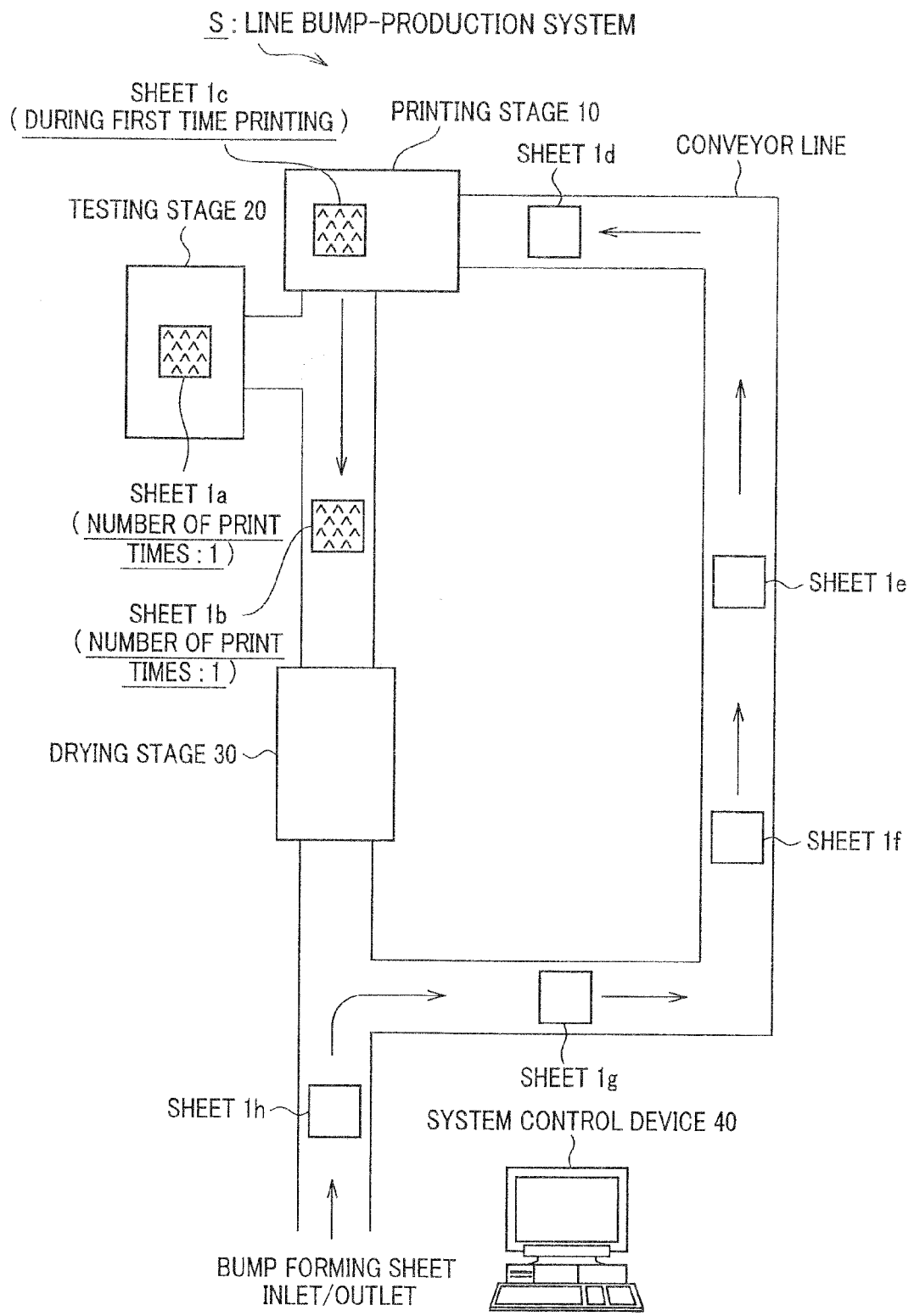
FIG. 2 is an external configuration diagram of the line bump-production system S continued from FIG. 1.

At the printing stage 10, silver paste printing is sequentially performed at each predetermined spot (on which a bump is to be formed) on the transported sheets 1. In this first embodiment, printing is performed on the sheet surface of each of the sheet 1a, the sheet 1b, the sheet 1c ..., as shown in FIGS. 1 and 2. To form bumps with a desired height, the printing is performed repeatedly on each spot a predetermined number of times (N times). In this first embodiment, the printing is repeated three times (N=3).

At the testing stage 20, a test is conducted on the sheet 1a, which is the first sheet having the first time printing (n=1) completed thereon (see FIGS. 1 and 2). The test is conducted to determine whether or not the bumps formed by the first time printing are at the prescribed positions and have a prescribed size. Since the silver paste has been printed only once at this point, the "prescribed size" is not equal to the bump height to be ultimately achieved, but is equal to the bump height that should be achieved through one time silver paste printing.

At the drying stage 30, preliminary drying after silver paste printing is performed.

Figure 3:
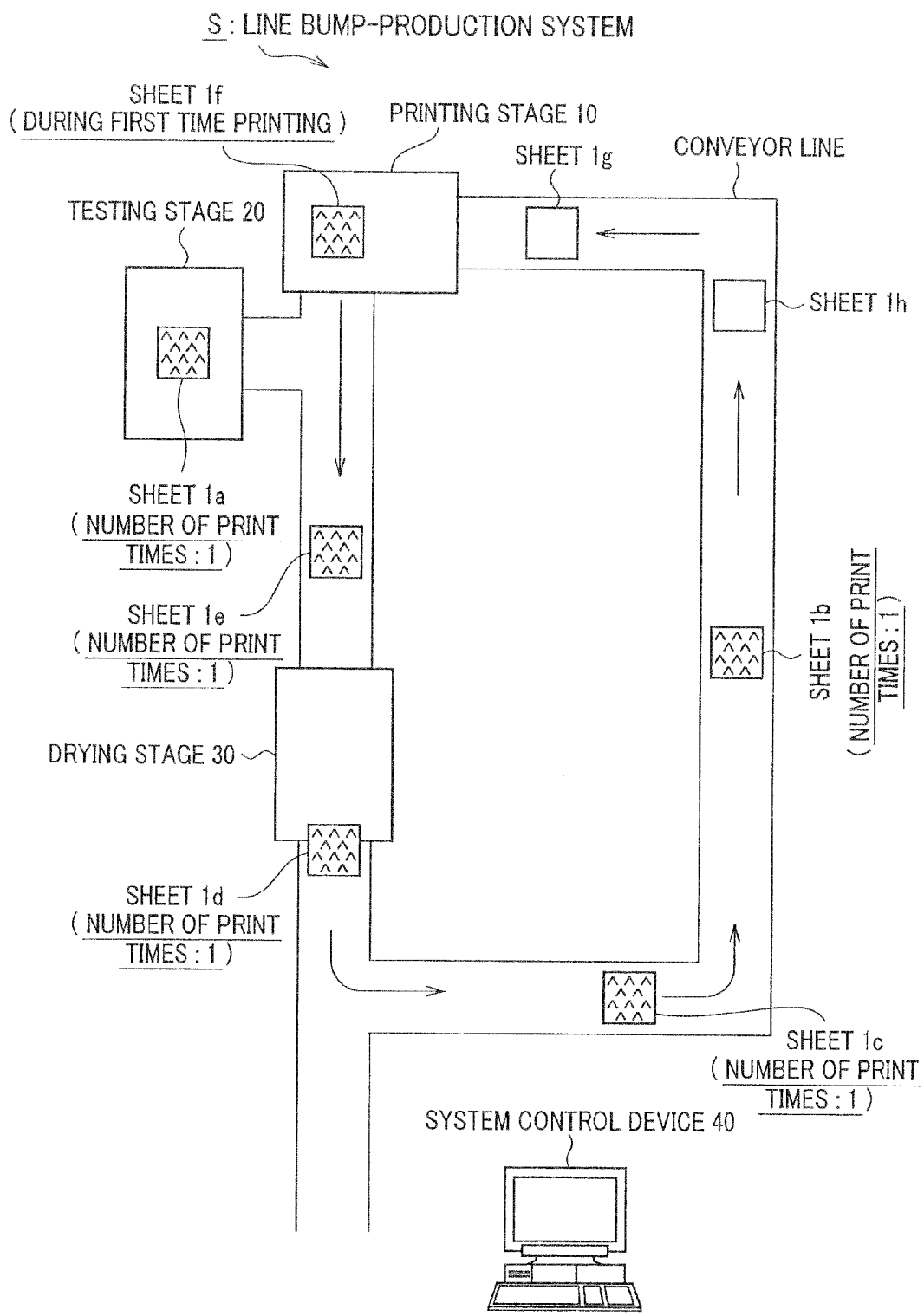
FIG. 3 is an external configuration diagram of the line bump-production system S continued from FIG. 2.

While the test is being conducted on the sheet 1a at the testing stage 20, the first time printing is sequentially performed on the sheets 1b through 1h at the printing stage 10 (see FIGS. 2 and 3). The test to check the first time printing is conducted only on the sheet 1a that is the first sheet having the first time printing completed thereon, but is not conducted on the other sheets 1b through 1h.

The computer (not shown) provided in the testing stage 20 transmits the result of the test conducted on the sheet 1a to the system control device 40 via a communication network (a wired or wireless network) (not shown), and returns the tested sheet 1a onto the conveyor line.

Figure 4:
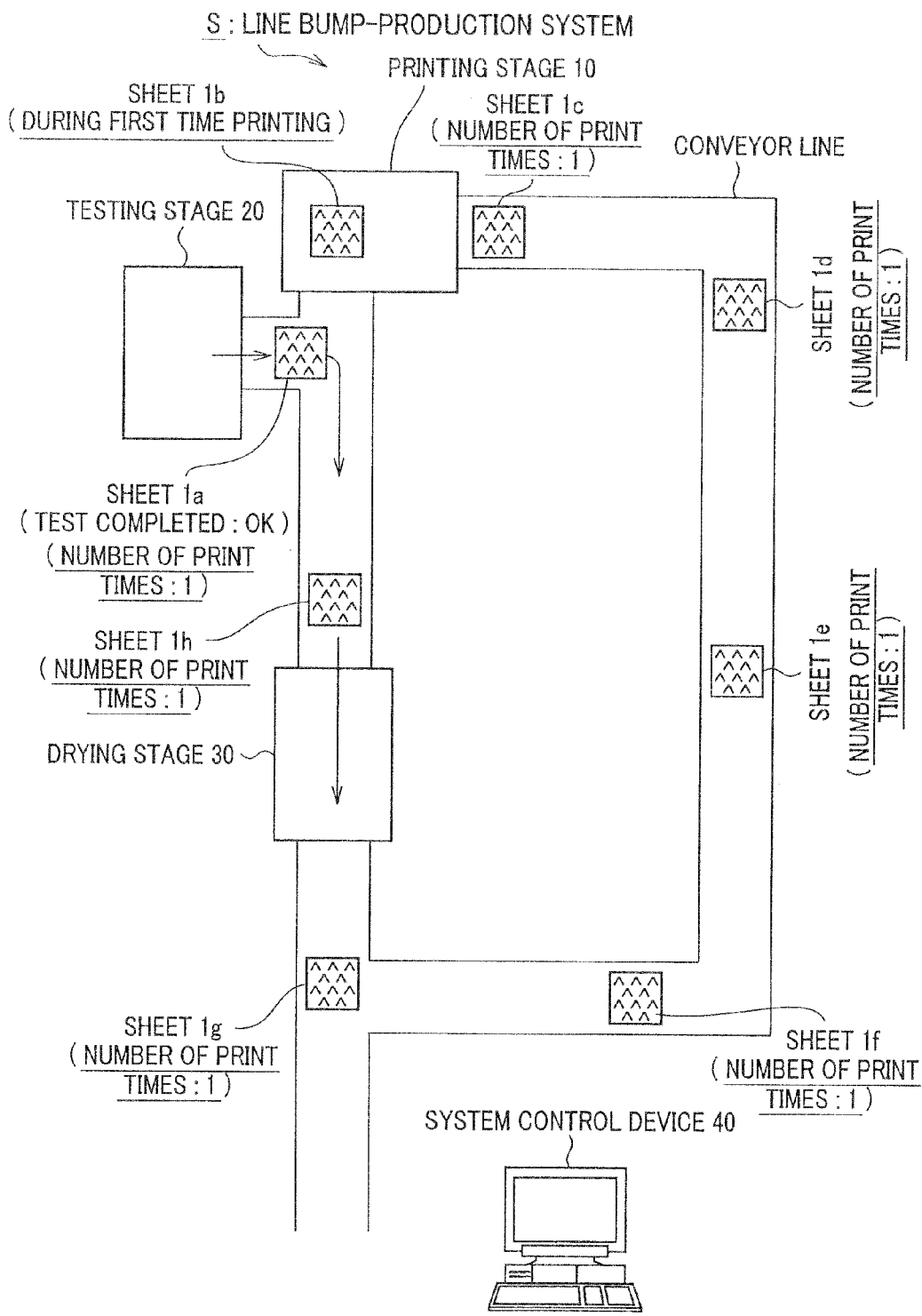
FIG. 4 is an external configuration diagram of the line bump-production system S continued from FIG. 3.

If the test result is good ("test OK"), the system control device 40 instructs the computer (not shown) provided in the printing stage 10 to start the second time printing, through the communication network (a wired or wireless network) (not shown) (see FIG. 4). When the computer provided in the printing stage 10 receives the instruction to perform the second time (n=2) printing from the system control device 40 based on the good result of the first time test, the printing stage 10 starts performing the second time printing on the sheet 1b.

When returning the sheet 1a onto the conveyor line, the testing stage 20 may return the sheet 1a after any one of the sheets 1 having the first time printing completed thereon.

However, it is preferable to return the sheet 1a after the last sheet 1h having the first time printing completed thereon, as shown in FIG. 4.

In the same manner as above, a test is also conducted on the sheet 1 having the second time printing completed thereon. Referring now to FIGS. 5 through 8, the procedures after the second time printing are described.

FIGS. 5 through 8 are system configuration diagrams illustrating the transportation of the subsequent sheets 1 after the second time printing is allowed (instructed) in FIG. 4, and the second time printing is performed on the sheet 1b.

Figure 5:
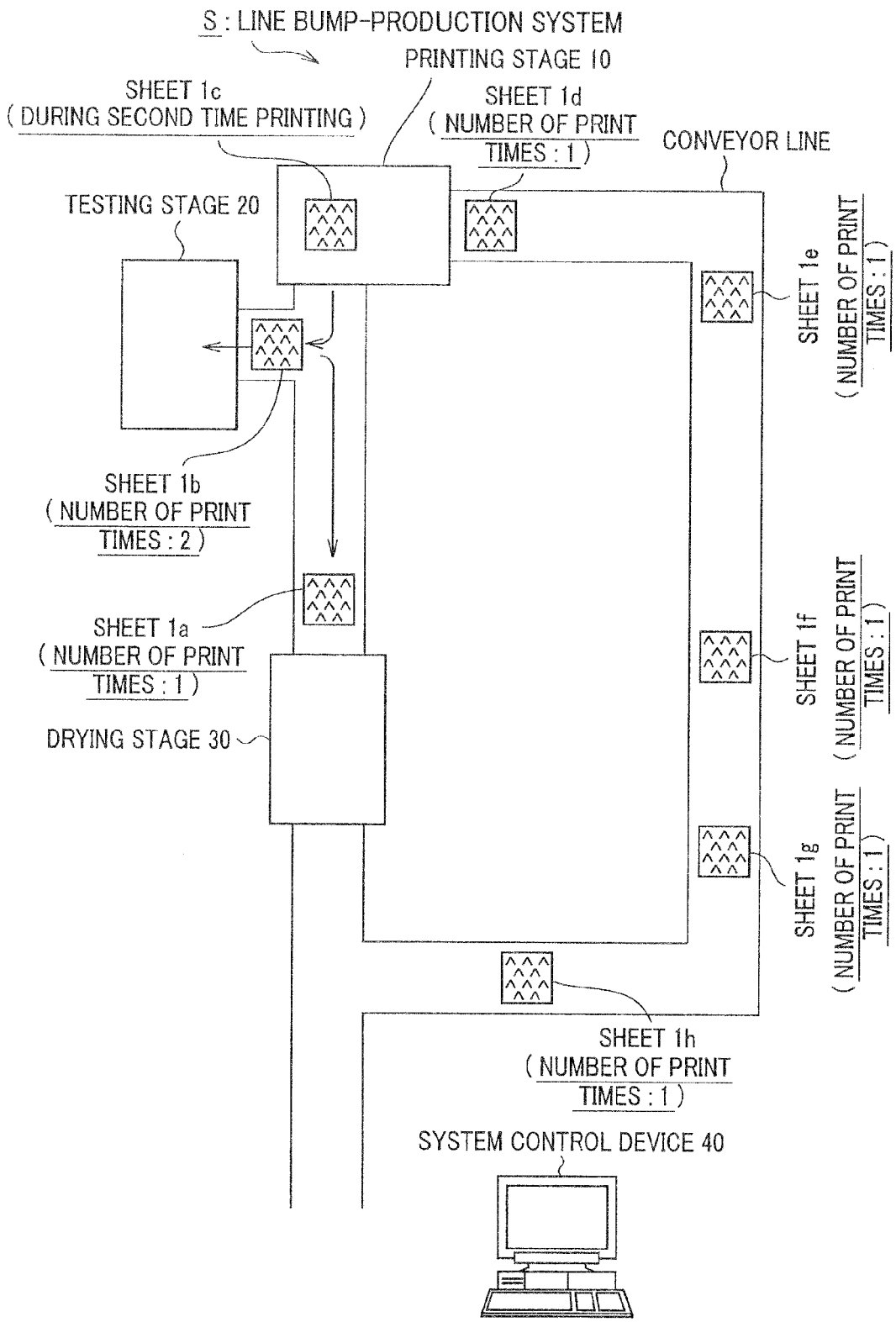
FIG. 5 is an external configuration diagram of the line bump-production system S continued from FIG. 4.
Figure 6:
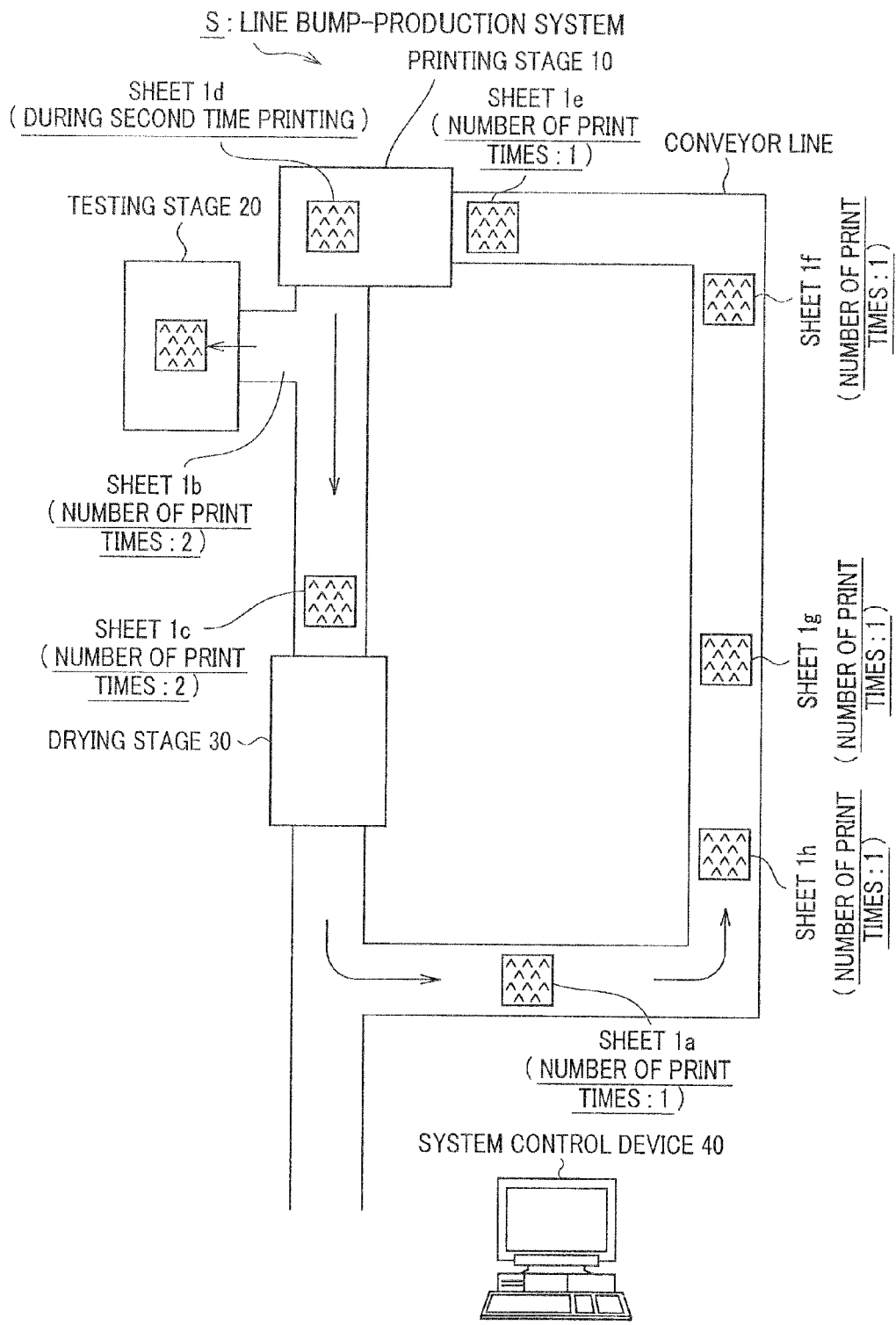
FIG. 6 is an external configuration diagram of the line bump-production system S continued from FIG. 5.

The testing stage 20 conducts a test on the sheet 1b that is the first sheet having the second time printing completed thereon (see FIG. 5). While the test is being conducted on the sheet 1b at the testing stage 20, the second time printing is sequentially performed on the sheets 1c through 1a at the printing stage 10 (see FIGS. 5 and 6). As in the above-described procedure, the test to check the second time printing is conducted only on the sheet 1b that is the first sheet having the second time printing completed thereon, but is not conducted on the other sheets 1c through 1a.

The computer (not shown) provided in the testing stage 20 transmits the result (a good result ("test OK"), for example) of the test conducted on the sheet 1b to the system control device 40. Upon receipt of this result, the system control device 40 instructs the computer (not shown) provided in the printing stage 10 to start performing the third time printing (see FIG. 7). The computer (not shown) provided in the testing stage 20 also returns the sheet 1b onto the conveyor line.

When the computer provided in the printing stage 10 receives the instruction to perform the third time (n=3) printing from the system control device 40 based on the good result of the second time test, the printing stage 10 starts performing the third time printing on the sheet 1c.

Figure 8:
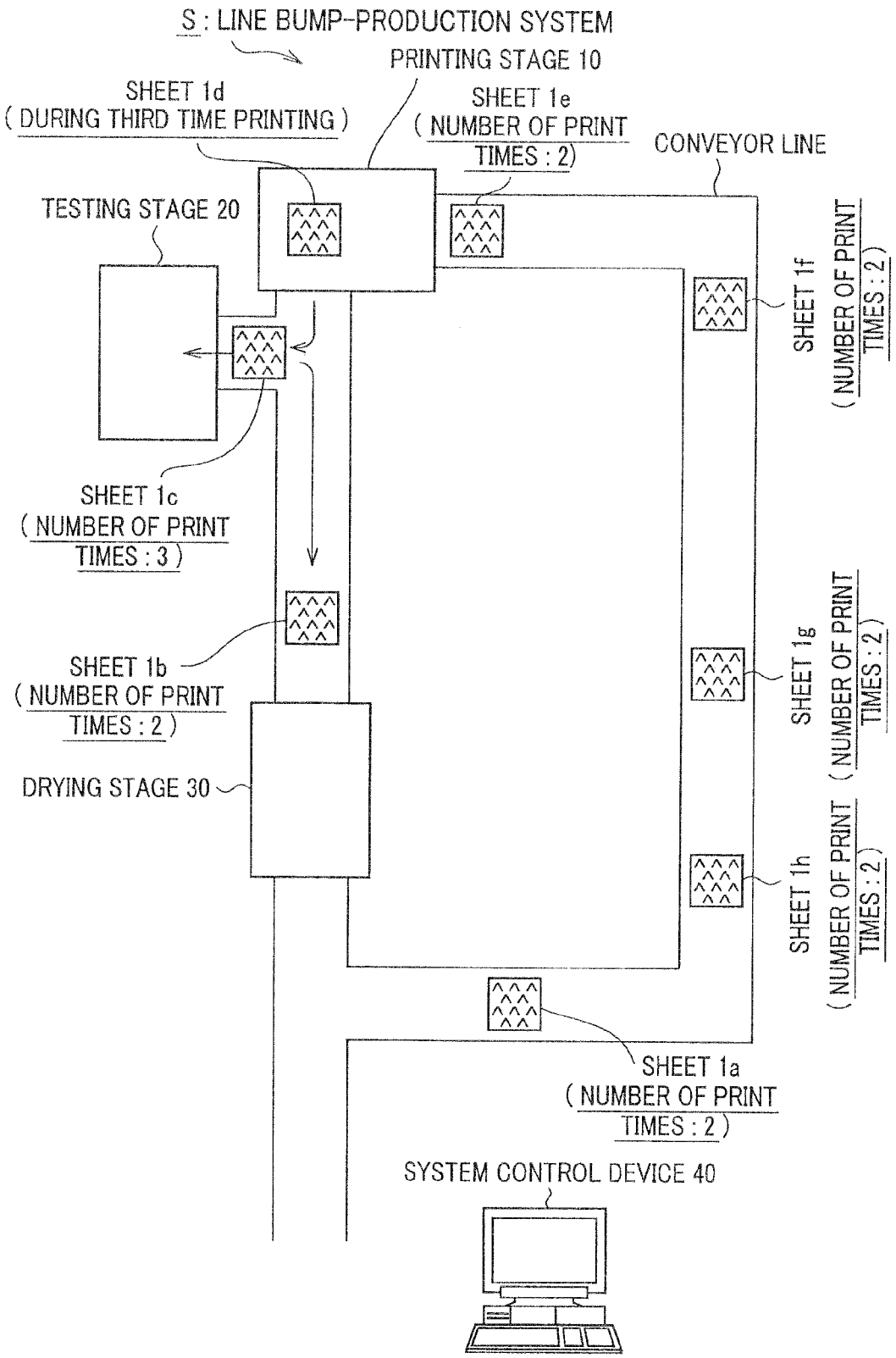
FIG. 8 is an external configuration diagram of the line bump-production system S continued from FIG. 7.

The testing stage 20 conducts a test on the sheet 1c that is the first sheet having the third time printing completed thereon (see FIG. 8). In the same manner as above, a test is conducted on the first sheet 1 having the nth time (n being a natural number in the range of one or lager to N or smaller) printing completed thereon, until the printing has been repeated the predetermined number of times (N times).

Figure 9:
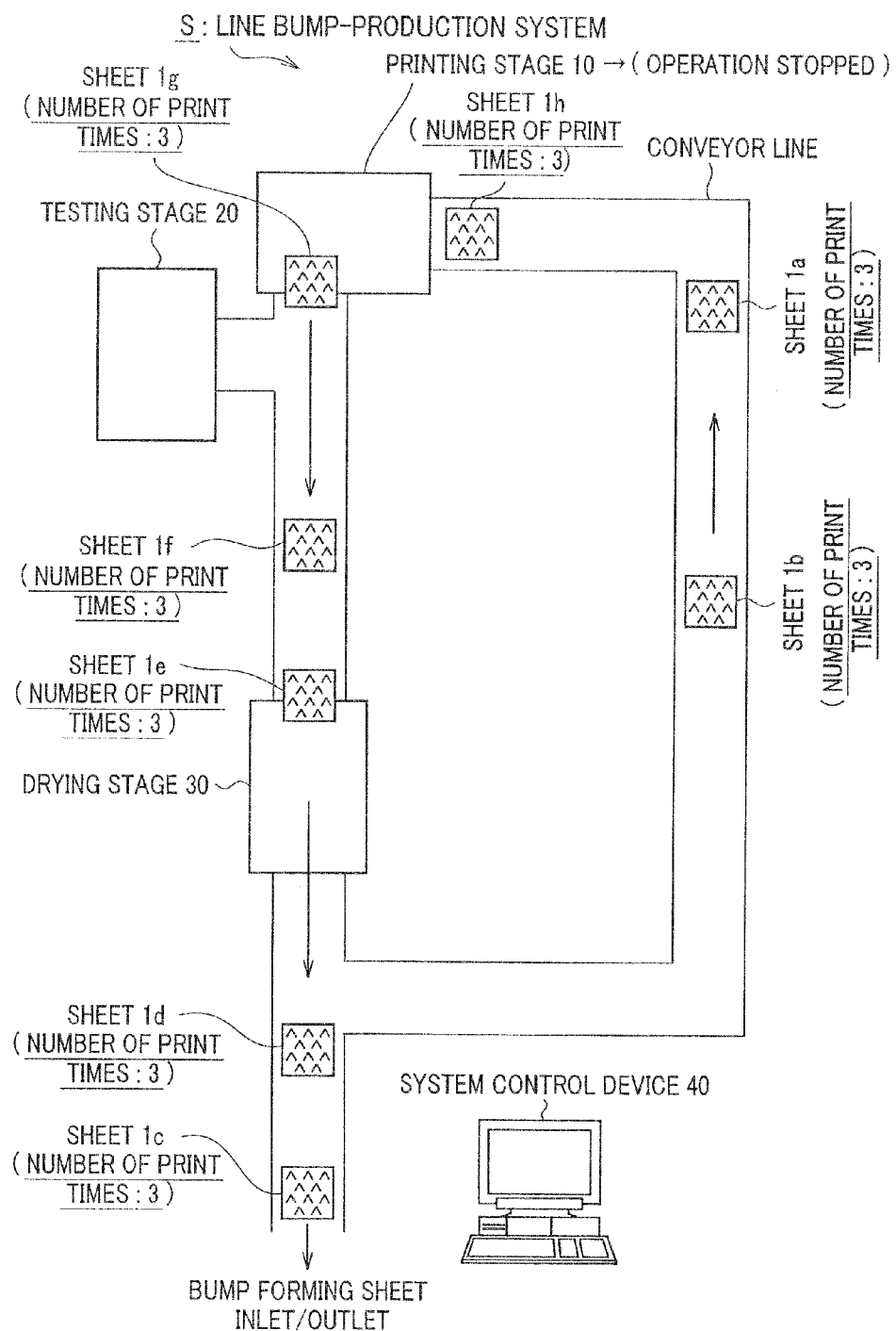
FIG. 9 is an external configuration diagram of the line bump-production system S continued from FIG. 8.
Figure 10:
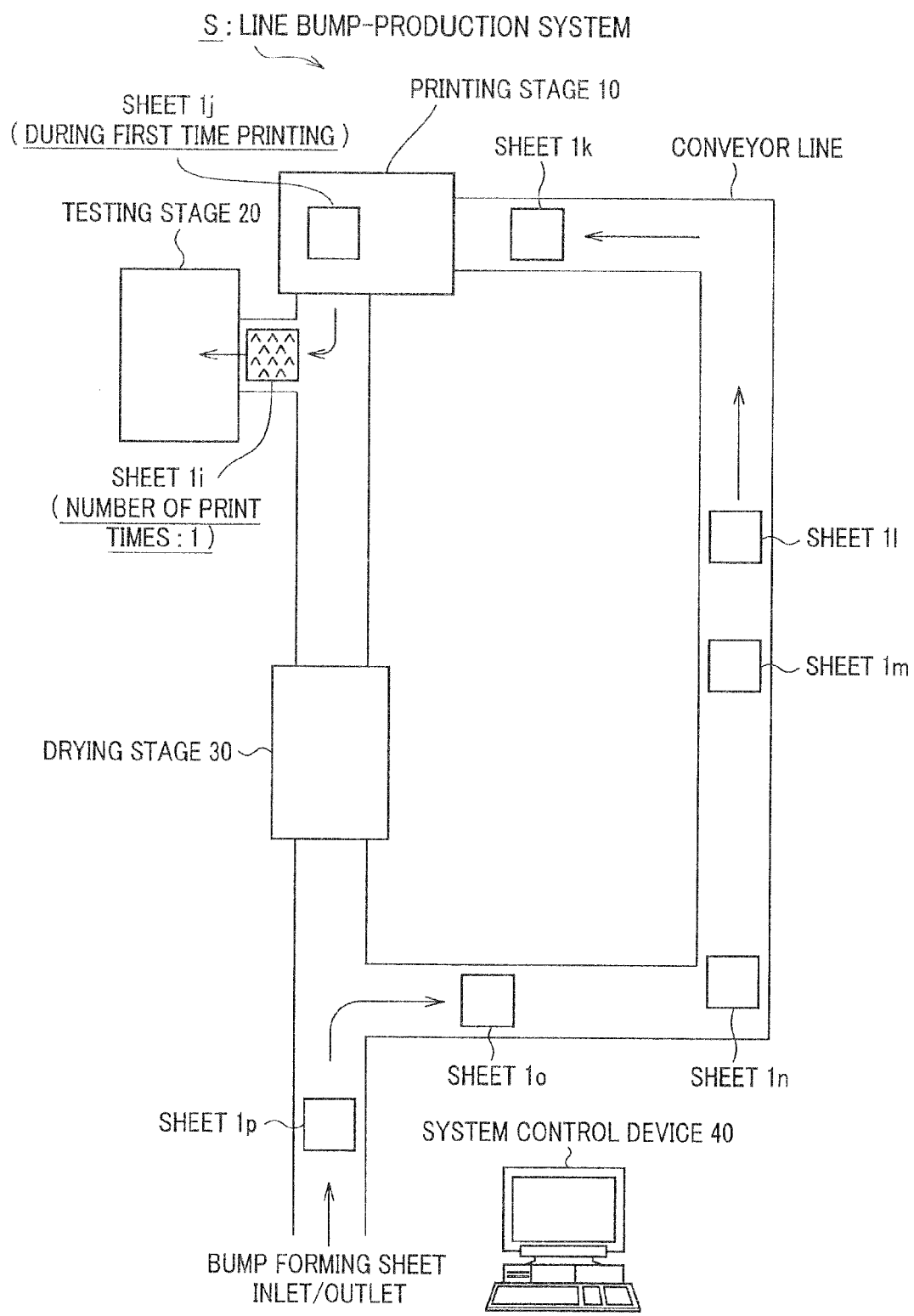
FIG. 10 is an external configuration diagram of the line bump-production system S continued from FIG. 9.

If all the results of the tests conducted to check the three time printing (n=1, 2, 3) are all good ("test OK"), the bump forming operation performed on the group of sheets 1a through 1h is properly completed, and the sheets 1a through 1h are discharged through the bump forming sheet inlet/outlet (see FIG. 9). New sheets 1i through 1p shown in FIG. 10 are then injected into the line bump-production system S.

Figure 11:
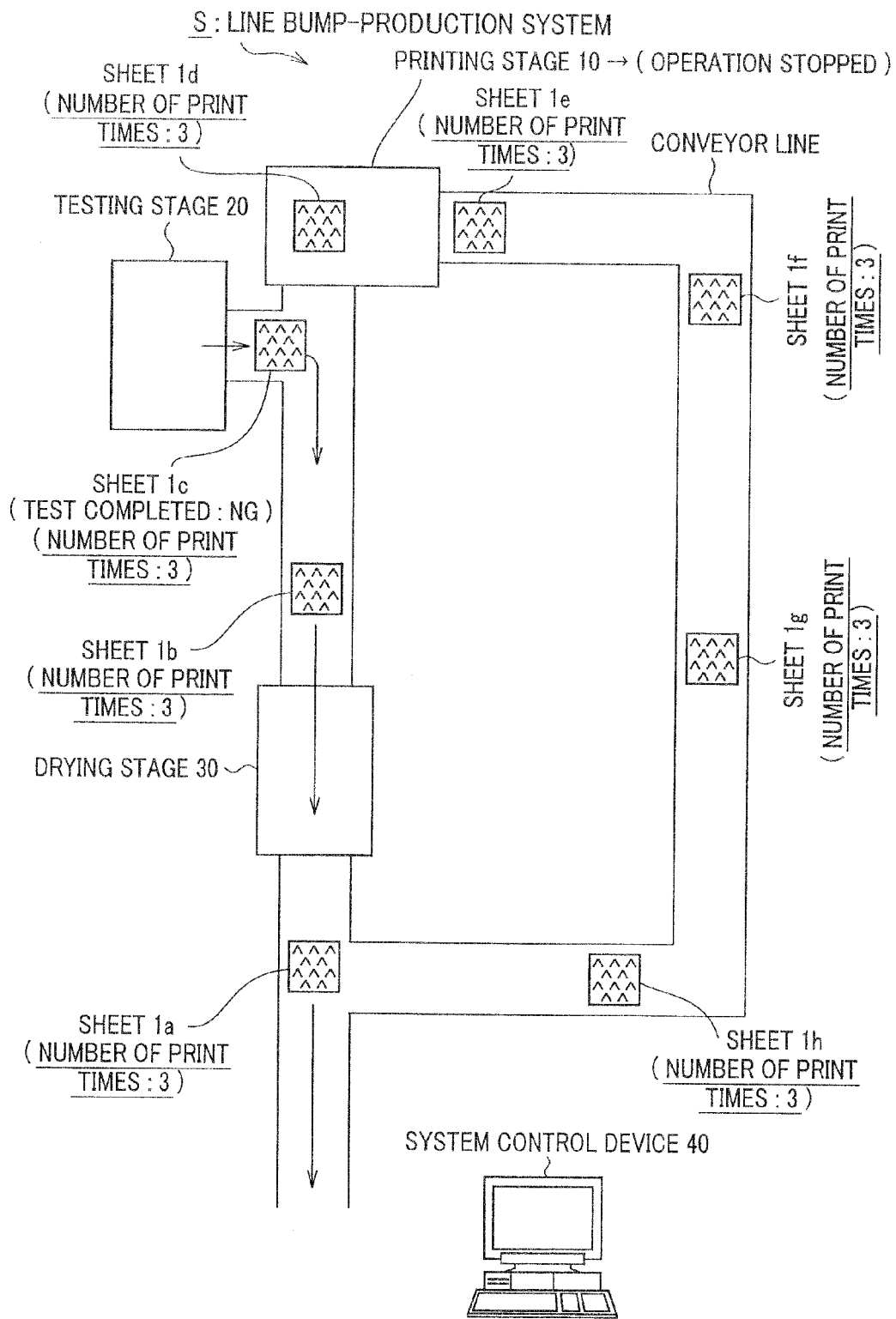
FIG. 11 is an external configuration diagram of another example of the line bump-production system S.

FIGS. 4 through 7 illustrate a case where the results of the tests conducted by the testing stage 20 are good. However, there are cases where the result of a test conducted by the testing stage 20 is not good ("test NG"), as shown in FIG. 11. In such a case, the computer provided in the testing stage 20 transmits the test result indicating that the sheet 1c has a defect ("test NG") to the system control device 40. Upon receipt of the result, the system control device 40 instructs the computer provided in the printing stage 10 to stop the printing.

When the computer provided in the printing stage 10 receives the instruction to stop the printing from the system control device 40 based on the bad result of the third time test, the printing stage 10 stops the ongoing third time printing on any of the other sheets 1d through 1b. The tested sheet 1c may be returned to the conveyor line, and be discharged through the bump forming sheet inlet/outlet, as shown in FIG. 11. Alternatively, the system control device 40 may stop the entire conveyor line, and notifies the operator of the bad test result The system S then stands by, while the operator cleans the plate, may check the printing conditions such as the speed of the squeegee for pushing ink against the plate and the distance between the plate and the sheet if the printing performed is screen printing, and may investigate and eliminate the other causes of the bad result. In this manner, when the result of a test is bad ("test NG"), processing should be performed to cope with the cause of each defect.

In accordance with the first embodiment, while the sheets 1 are being transported, printing is repeatedly performed on the plurality of the sheets 1 N times. A test is conducted on the first sheet 1 having the nth time printing completed thereon, and after the test, the sheet 1 is returned to a spot behind another sheet 1 having the nth time printing completed thereon. Accordingly, the test to check the nth time processing can be completed before the next time ((n+1)th time) printing, and the results of the tests conducted during the printing operation can be collected before all the printing is completed the predetermined number of times. The first sheet 1 that is being transported on the conveyor line and has the nth time printing completed thereon is pulled out of the conveyor line, and a test is conducted on the first sheet 1 at the test stage 20. During the test, the other sheets do not stop and continue to be transported, and the nth time printing is sequentially performed. The extension of time (the time loss) in the entire bump forming operation caused by pulling out the first sheet 1 and conducting a test on the first sheet 1 can be reduced to a very small amount of time (more specifically, the very small amount of time required to return the sheet last tested by the testing stage 20 to the conveyor line).

When the result of a test is not good, the printing by the printing stage 10 is immediately stopped. Accordingly, the test result can be promptly reflected in the printing to be performed on the other sheets 1.

Further, after the result of a test conducted to check the nth time printing is received, the next time ((n+1)th time) test is conducted. Accordingly, the test to check the nth time printing can be completed before the next time ((n+1)th time) printing is performed. Thus, the result of the test to check the nth time printing can be promptly fed back to the next time printing, and unnecessary printing is minimized.

Figure 7:
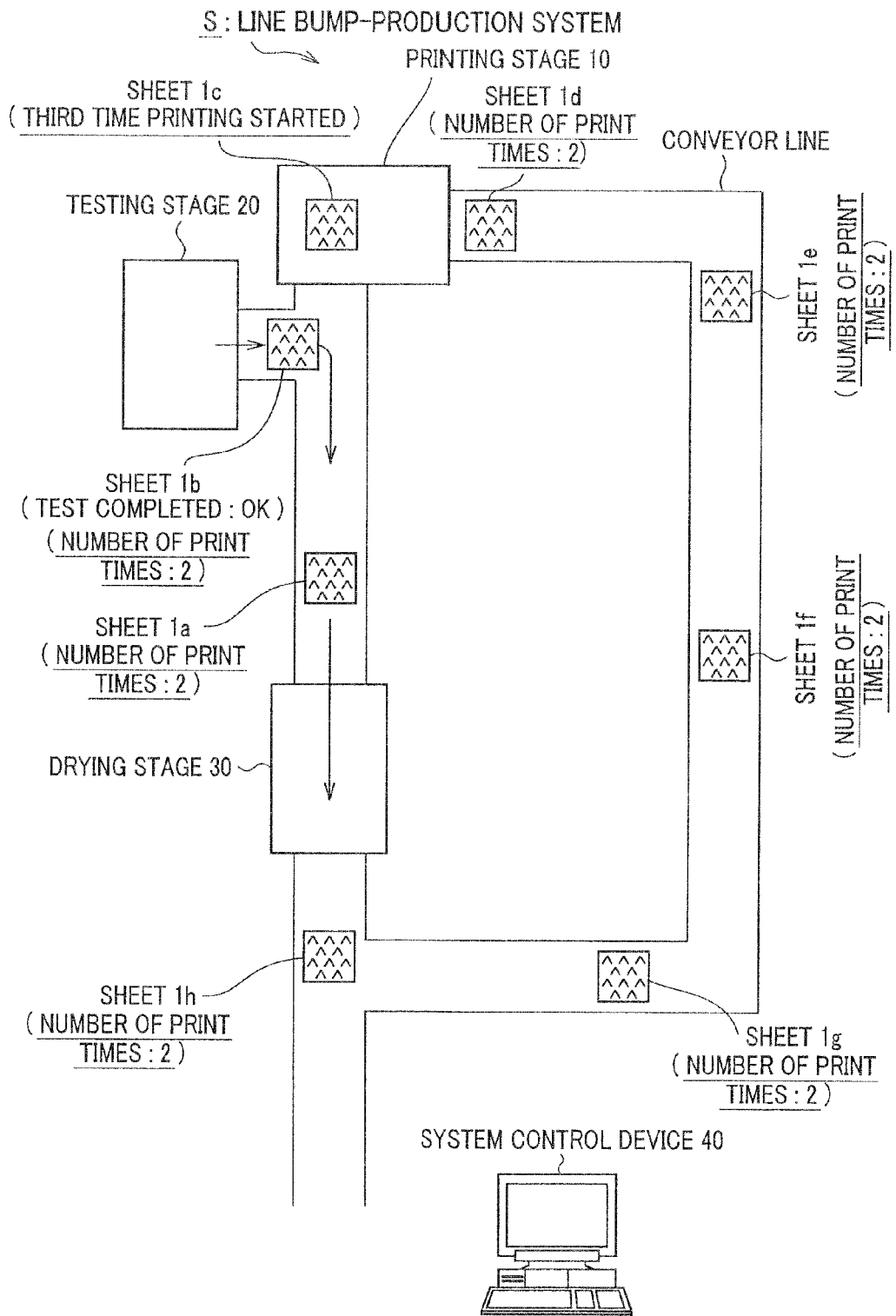
FIG. 7 is an external configuration diagram of the line bump-production system S continued from FIG. 6.
Figure 12:
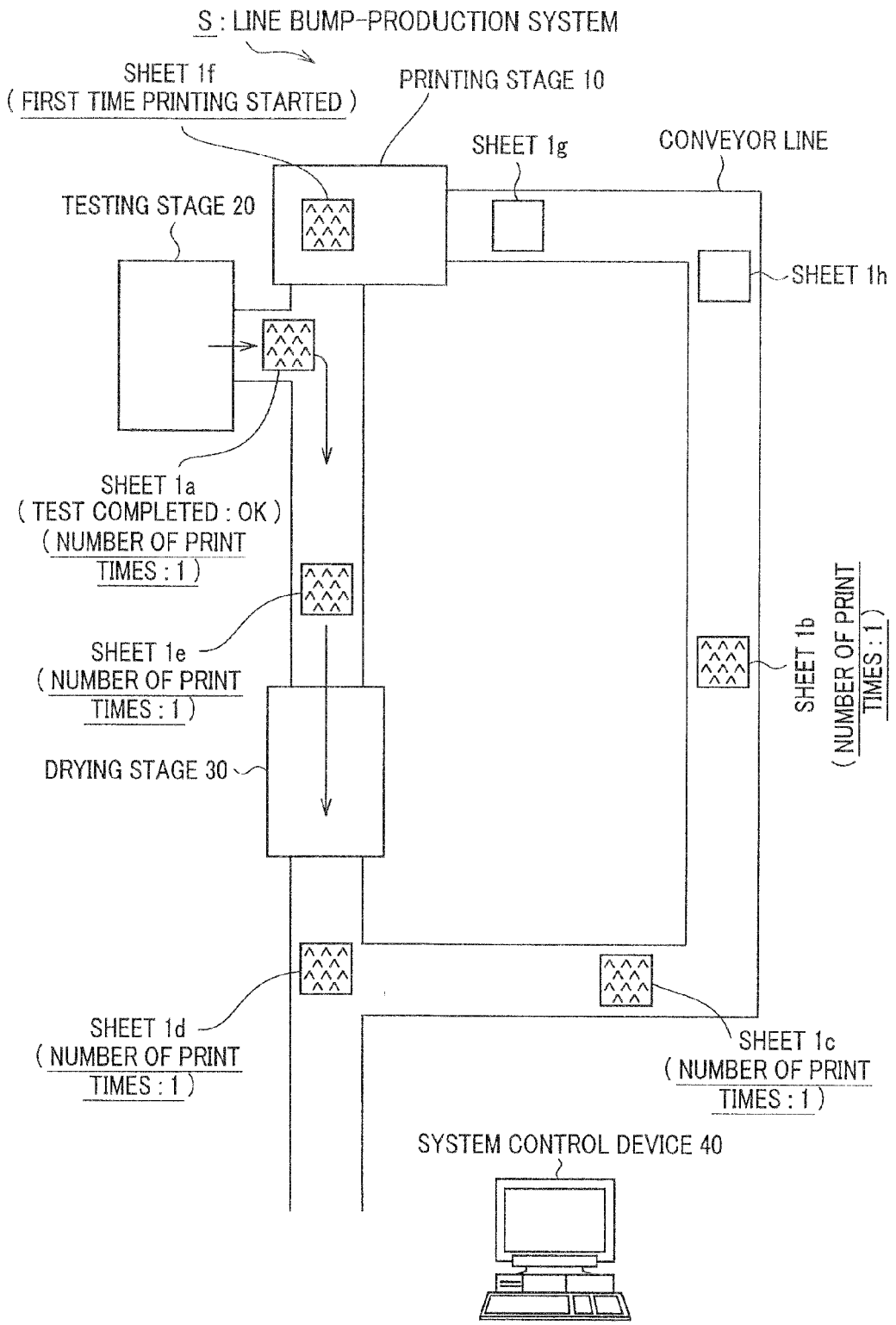
FIG. 12 is an external configuration diagram of yet another example of the line bump-production system S.

In the first embodiment, the sheet 1a (the number of print times: 1) after the test is returned to a spot behind the sheet 1h that is the last sheet having the first time printing completed thereon, and the sheet 1b (the number of print times: 2) after the test is returned to a spot behind the sheet 1a that is the last sheet having the second time printing completed thereon, as shown in FIGS. 4 and 7. In other words, after the test, the sheet 1 having the nth time printing completed thereon is returned to a spot behind the sheet 1 having the nth time printing last performed thereon. However, the present invention is not limited to that structure, and the sheet 1a (the number of print times: 1) after the test may be returned to a spot behind the sheet 1e, as shown in FIG. 12. In this manner, after the test, the sheet 1 having the nth time printing completed thereon may be returned to a spot behind any of the other sheets 1 having the nth time printing completed thereon.

In the first embodiment, the printing stage 10 and the testing stage 20 receive and transmit the results of tests via the system control device 40. However, the computer (the testing device) provided in the testing stage 20 may be designed to send the test results directly to the computer (the processing device) provided in the printing stage 10.

(II) Second Embodiment

The following is a description of a second embodiment as another preferred embodiment of the present invention, with reference to the accompanying drawings.

Figure 13:
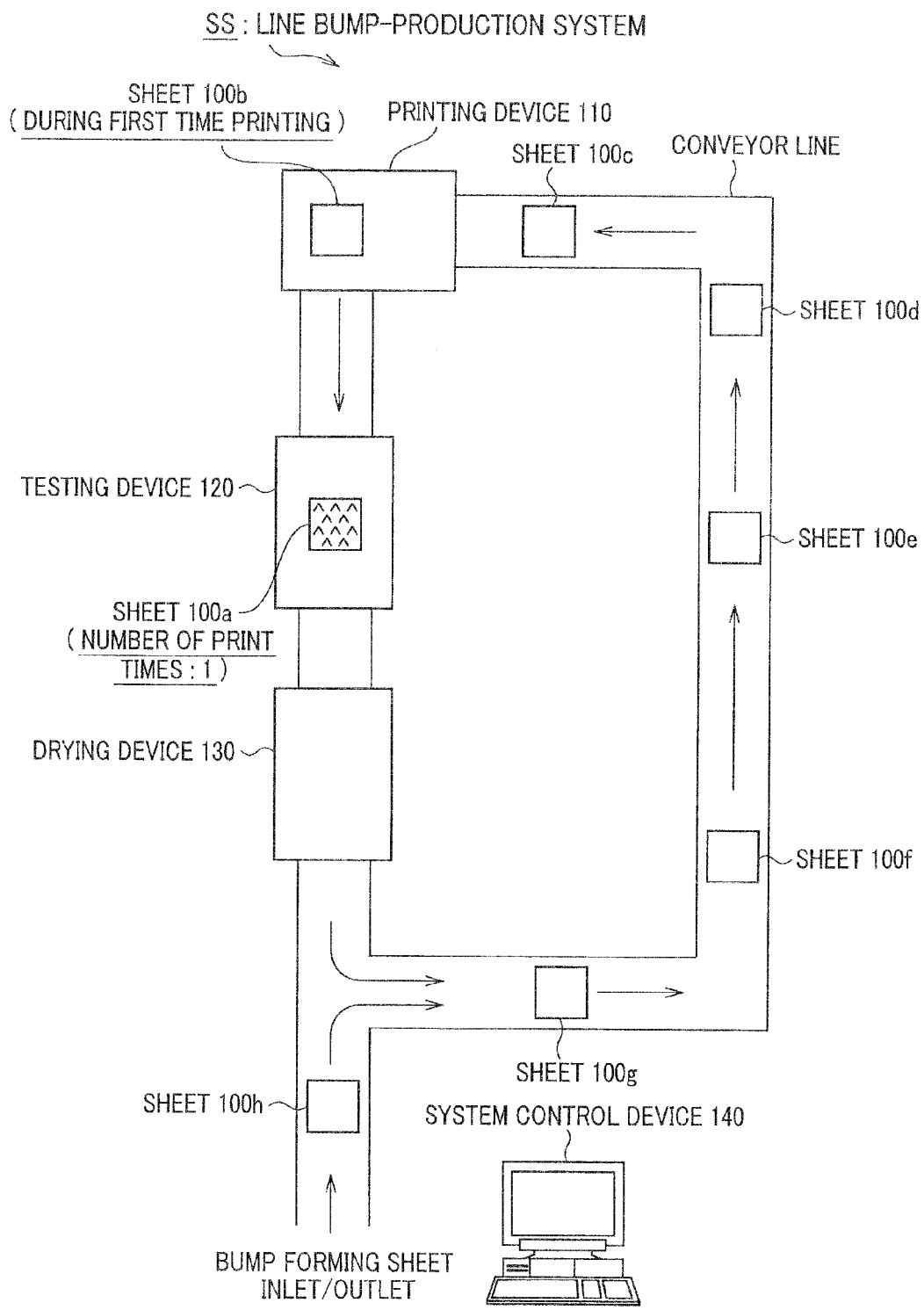
FIG. 13 is an external configuration diagram of a line bump-production system SS in accordance with a second embodiment of the present invention.

FIG. 13 is an external configuration diagram of a line bump-production system SS in accordance with the second embodiment.

The line bump-production system SS includes: a printing device 110 (an example of the processing device of the present invention) that prints silver paste onto sheets 100 (100a through 100h) as an example of objects; a testing device 120 that conducts tests to check whether each of the bumps exists properly, has a predetermined height, and is located in a predetermined position; a drying device 130 that performs preliminary drying on the printed silver paste, and a system control device 140 that exchanges information with the printing device 110, the testing device 120, and the drying device 130, and transmits a control signal to each of the devices. The drying device 130 may be placed before the testing device 120. Alternatively, the drying device 130 may not be provided in this system SS, and each sheet 100 may be dried after being discharged from this system SS. Further, some other processing device may be provided as well as the printing device 110 in this system SS.

The sheets 100 may be copper-foil sheet substrates that are used as buildup printed wiring boards for the high-density packaging according to $B^2$it, for example. The sheets 100 are sequentially injected into the system SS from a bump forming sheet inlet/outlet. Each of the sheets 100 injected into the system SS is transported on a conveyor line.

In the printing device 110, silver paste printing is sequentially performed at each predetermined spot (on which a bump is to be formed) on the transported sheets 100. In this second embodiment, printing is performed on the sheet surface of each of the sheet 100a, the sheet 100b, the sheet 100c . . . , in this order as shown in FIG. 13. To form bumps with a desired height, the printing is performed repeatedly on each spot a predetermined number of times (N times, N being 3, for example).

The testing device 120 functions as an image capturing unit and a testing unit, and conducts a test with a camera capturing an image of the sheet 100a having the nth time (n being a natural number of N or less) printing completed thereon by the printing device 110. This test is conducted to determine whether or not the bumps formed by the first time printing are at the prescribed positions and have a prescribed size in an image capture region on the sheet 100a. Since the silver paste has been printed only once at this point, the "prescribed size" is not equal to the bump height to be ultimately achieved, but is equal to the bump height that should be achieved through one time silver paste printing. The area that should be tested on each sheet is larger than the area of an image that can be captured by the camera. Therefore, only a partial image of the sheet 100a is captured by the camera.

Next, the image capture region to be captured by the camera is described in detail, with reference to the accompanying drawings.

Figure 14:
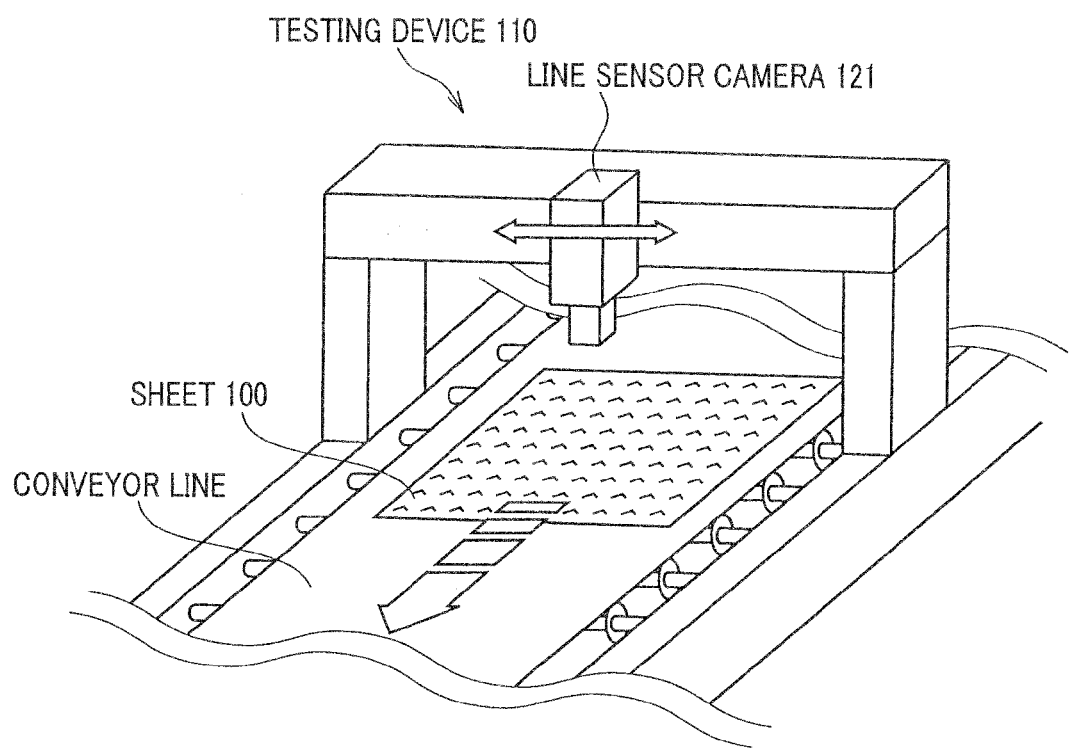
FIG. 14 is an external configuration diagram of the testing device 120.

FIG. 14 is an external configuration diagram of the testing device 120.

In the testing device 120, a line sensor camera 121 as an example of the camera of the present invention is provided movably in a direction perpendicular to the direction in which the sheets 100 are transported on the conveyor line.

Figure 15:
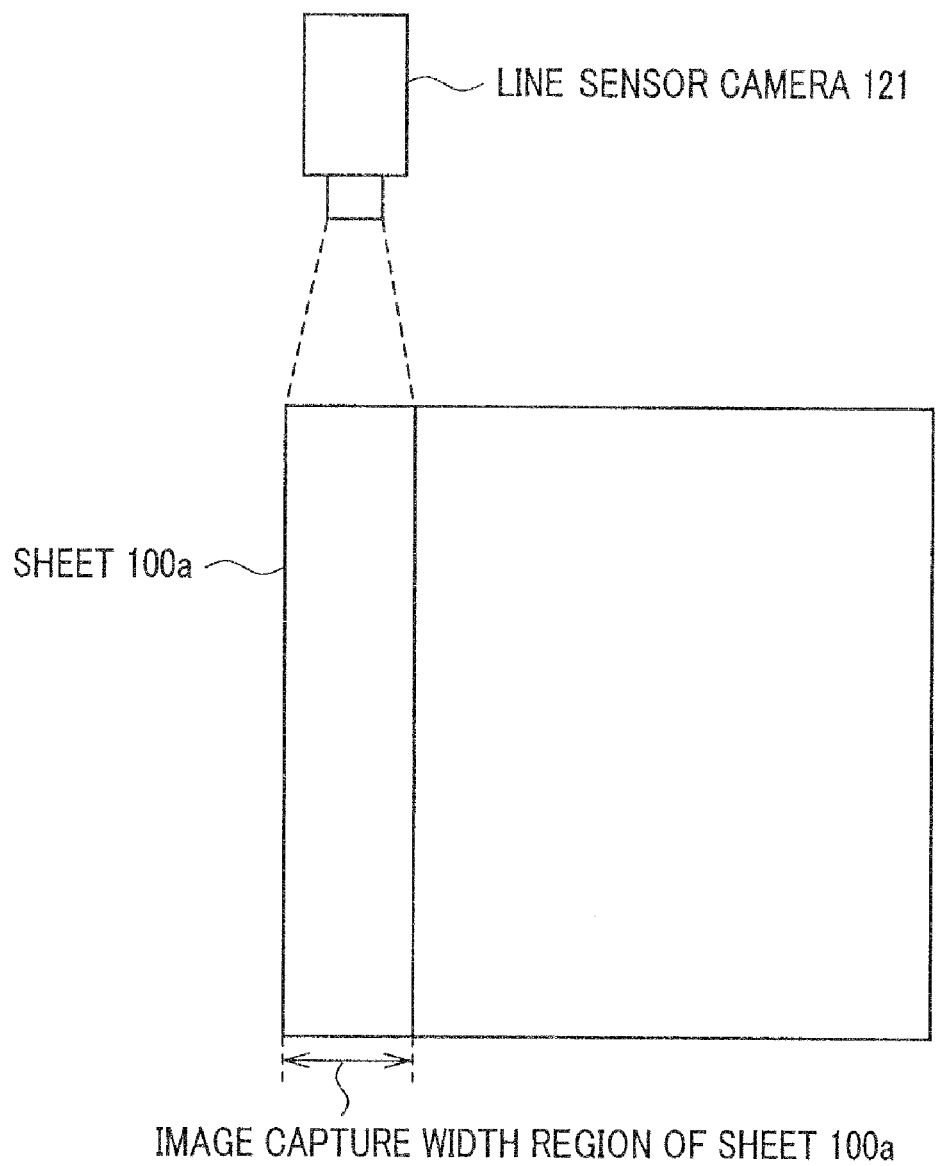
FIG. 15 illustrates a situation where an image of the sheet 100a is being captured by the line sensor camera 121.
Figure 16A:
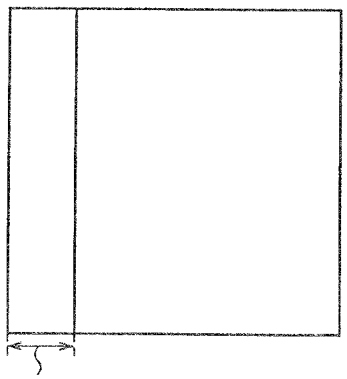
FIG. 16 illustrates the image capture regions of the sheets 100a through 100e.
Figure 16B:
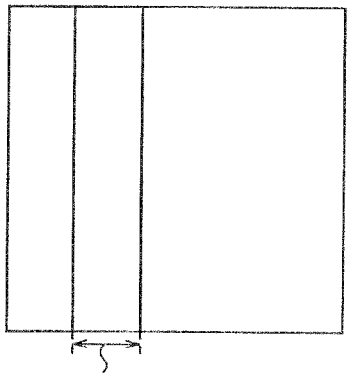
Figure 16C:
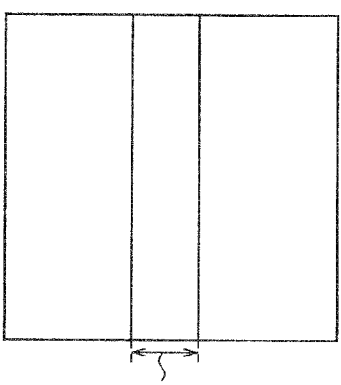
Figure 16D:
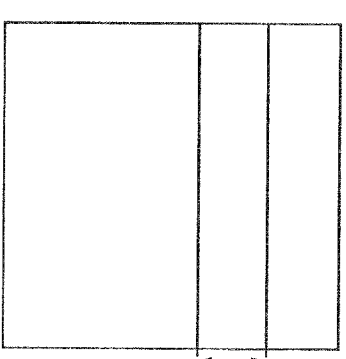
Figure 16E:
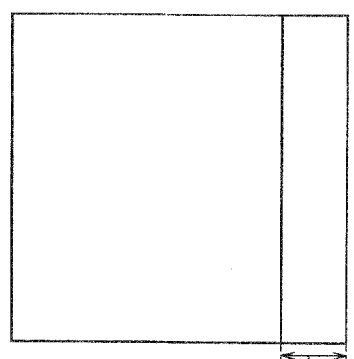

FIG. 15 illustrates a situation where an image of the sheet 100a having the first time printing completed thereon is being captured by the line sensor camera 121. In the second embodiment, the area that should be tested on each sheet is the entire surface of each sheet 100 that is larger than the size of an image that can be captured by the line sensor camera 121.

The image capture region on the sheet 100a is an area having an image capture width that can be captured by the line sensor camera 121. In the example case illustrated in FIG. 15, the area having the image capture width at the left side of the sheet 100a is the image area to be captured by the line sensor camera 121.

After capturing the image of the sheet 100a, the line sensor camera 121 moves to a position for capturing an image of the next sheet 100b (moving unit).

Like the sheet 100a, the sheet 100b having the first time printing completed thereon is transported to the testing device 120. Also here, the line sensor camera 121 captures an image of the area having the image capture width, as in the case of the sheet 100a. The image capture region on the sheet 100b is in an area excluding the area corresponding to the image capture area on the sheet 100a (or the image capture region on the sheet 100b is different from the image capture region on the sheet 100a). To operate the line sensor camera 121 in this manner after the image of the sheet 100a is captured, the line sensor camera 121 should be moved at least by the distance equivalent to the image capture width that can be captured by the line sensor camera 121.

FIG. 16 shows schematic views for explaining the image capture regions of the sheets 100a through 100e to be captured by the line sensor camera 121. FIG. 16 illustrates an example case where the line sensor camera 121 captures images of the five sheets 100a through 100e having different image capture regions, while being moved only by the image capture width every time image capturing is completed. In this manner, tests are sequentially conducted on the sheets 100a through 100e transported on the conveyor line, based on the captured images of the sheets 100a through 100e. Accordingly, the entire surface (the test area) of the sheet 100 having the first time printing completed thereon is examined. By conducting tests based on the captured images of the respective image capture width regions of the sheets 100, a common defect among all the sheets 100 can be detected. The common defect among all the sheets 100 may be a defect caused by the plate, such as clogging in the plate.

After the tests, the testing device 120 transmits the results of the tests conducted to check the first time printing to the system control device 140 via a communication network (including a wired or wireless communication network) (not shown).

When the results of the tests are good ("test OK"), the system control device 140 allows the printing device 110 to continue the printing via the communication network (a wired or wireless communication network) (not shown). Receiving an instruction to continue the printing from the system control device 140, the printing device 110 performs the first time printing on the sheets 100 not yet having the first time printing completed thereon among the remaining sheets 100f through 100h at the time of receiving the instruction, and also performs the second time printing on the sheets 100a, 100b, 100c . . . that are again transported to the printing device 110.

If the results of the tests indicate there is a defect ("test NG"), the system control device 140 instructs the printing device 110 to stop the printing.

Upon receipt of the instruction to stop the printing from the system control device 140 based on the bad test results, the printing device 110 immediately stops the printing. After stopping the printing, the printing device 110 may discharge all the sheets 100 existing on the conveyor line through the bump forming sheet inlet/output. Alternatively, the system control device 140 may stop the entire conveyor line, and notifies the operator of the bad test results. The system SS then stands by, while the operator cleans the plate, may check the printing conditions such as the speed of the squeegee for pushing ink against the plate and the distance between the plate and the sheet if the printing performed is screen printing, and may investigate and eliminate the other causes of the bad result. In this manner, when the test results are bad ("test NG"), processing should be performed to cope with the cause of each defect.

Figure 17:
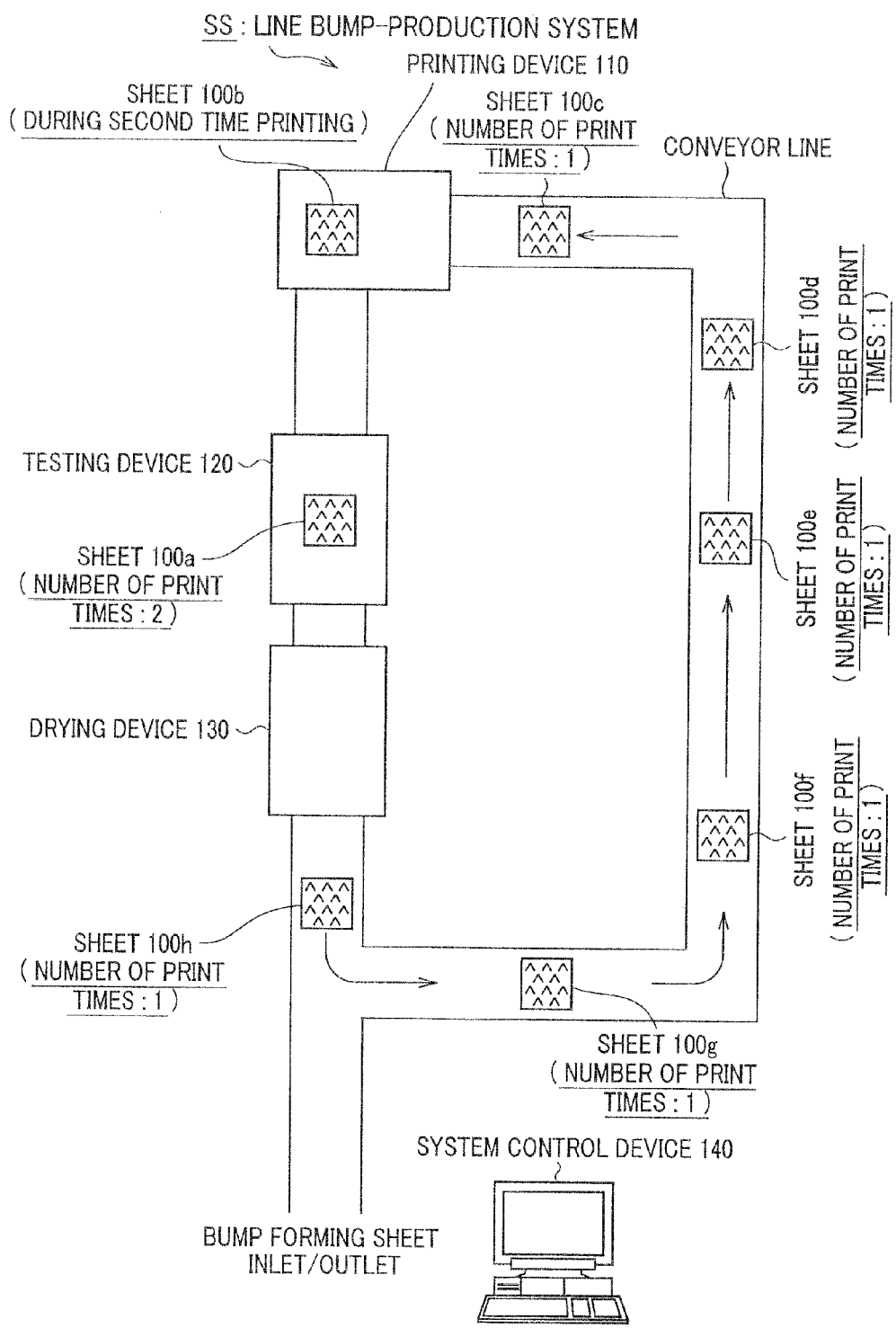
FIG. 17 is an external configuration diagram of the line bump-production system SS.
Figure 18:
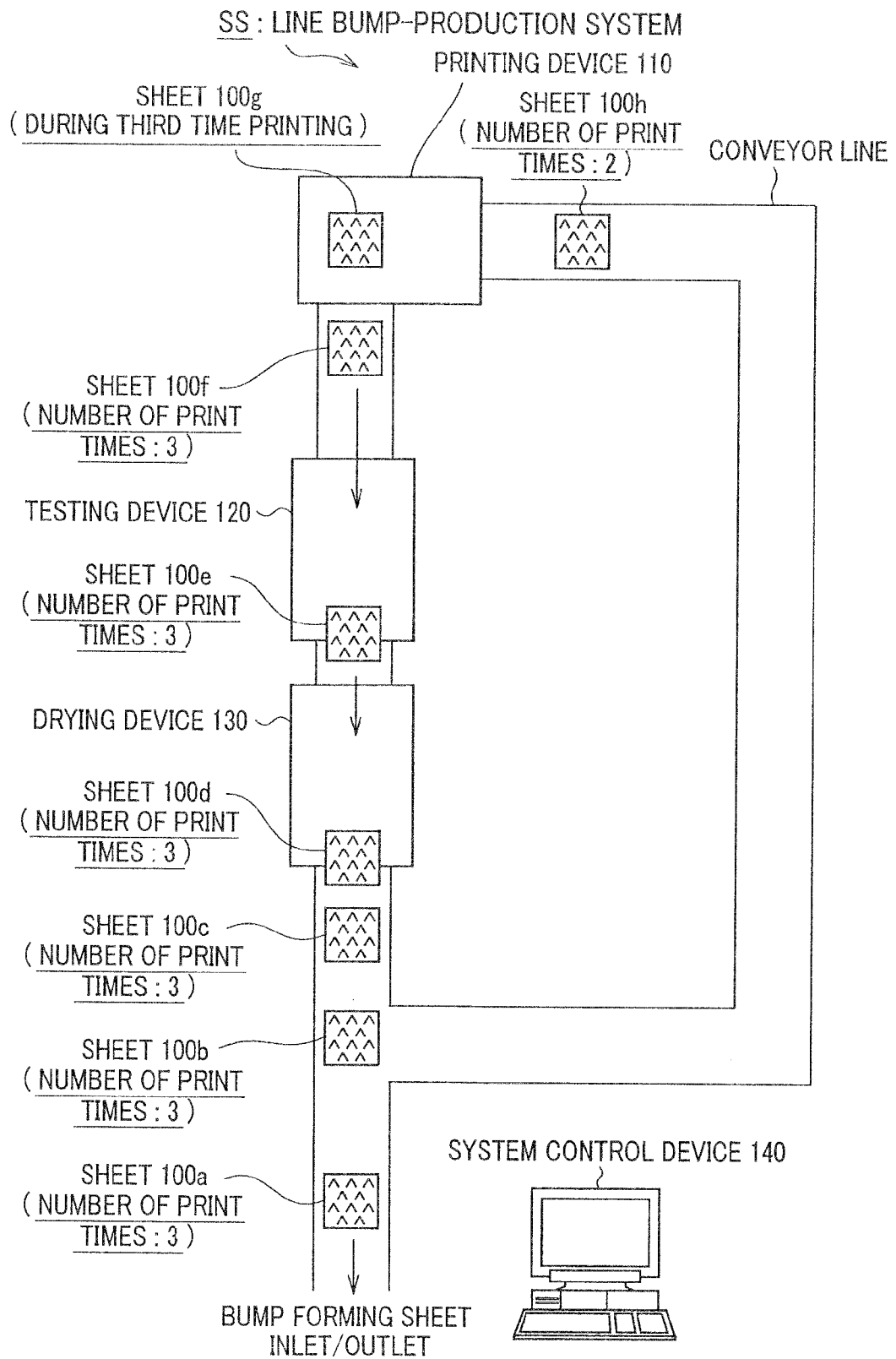
FIG. 18 is an external configuration diagram of the line bump-production system SS after the bump forming operation is completed on the sheets 100a through 100h.
Figure 19:
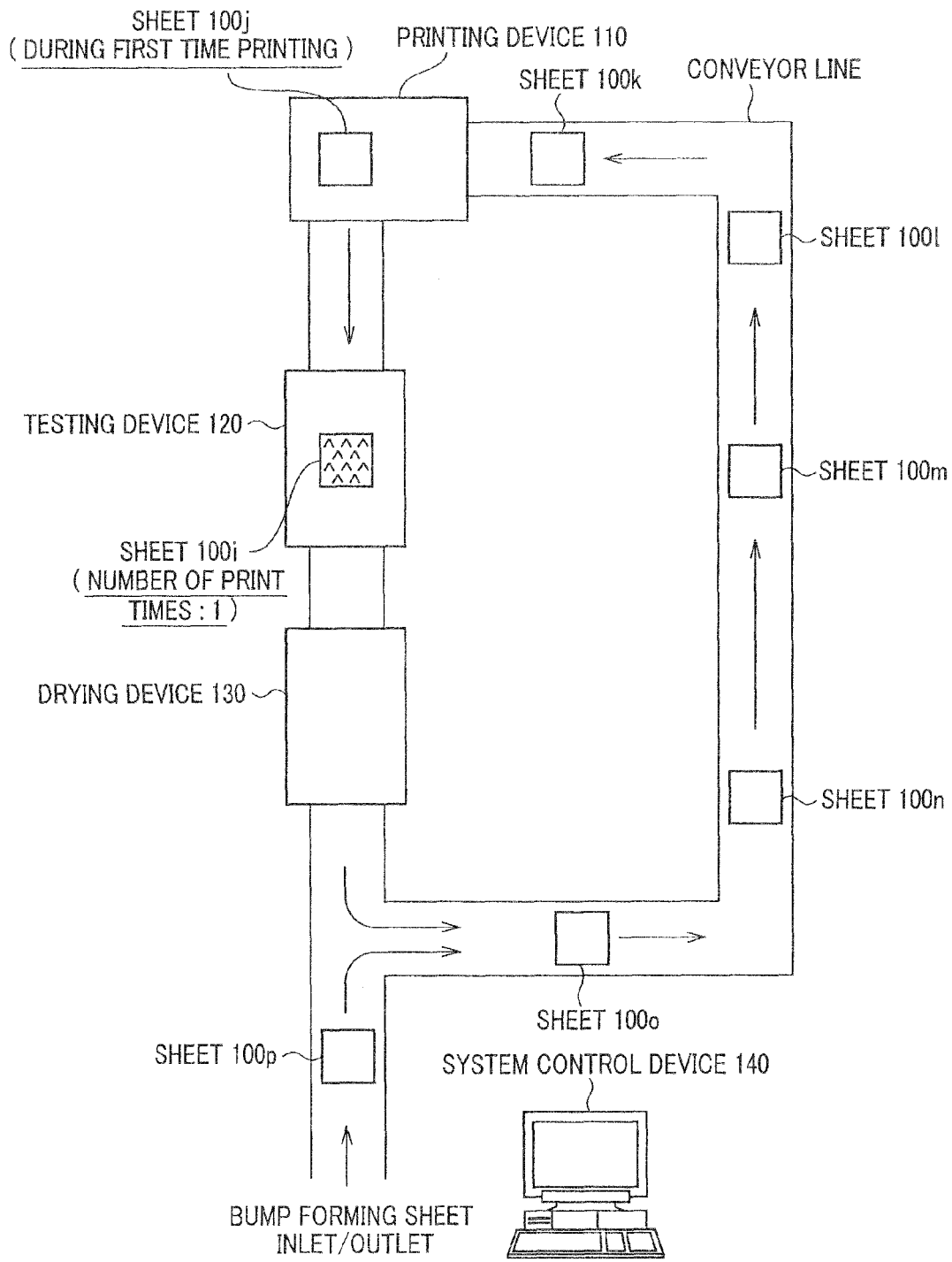
FIG. 19 is an external configuration diagram of the line bump-production system SS continued from FIG. 18.

If the results of the tests conducted to check the first time printing are good, each of the sheets 100 tested by the testing device 120 is transported again to the printing device 110 via the drying device 130, and is subjected to the second time printing (see FIG. 17). To conduct tests after the second time printing, images of the sheets 100a through 100e transported on the conveyor line are sequentially captured, as in the case of the first time tests. Based on the captured images, the tests are conducted to examine the entire surface of each sheet 100 having the second time printing completed thereon. If the results of the tests conducted to check the third time printing are all good ("test OK"), the bump forming operation on the group of sheets 100a through 100h is properly completed, and the sheets 100a through 1000h are discharged through the bump forming sheet inlet/output, as shown in FIG. 18. New sheets 100i through 100p are then injected into the line bump-production system SS (see FIG. 19).

In a case where the entire surface of each sheet 100 can be examined by conducting tests on the five sheets 100a through 100e as in the second embodiment, the first time and second time image capturing (examination) may not be performed on the remaining sheets 100f through 100h following the sheet 100e. Alternatively, the first time tests may be performed on the sheets 100a through 100e, and the second time tests may be performed on five sheets including the sheets 100f through 100h not having the first time tests conducted thereon.

In accordance with the second embodiment, where tests are conducted while the sheets 100 each having a test area that is larger than the image capture range (the image capture size) of the line sensor camera 121 are being transported, the line sensor camera 121 is moved to capture images of the image capture regions different from one another of the transported sheets 100. Accordingly, the entire test area of each sheet 100 can be examined with one camera. For example, a common defect among all the sheets 100 can be detected with one camera.

After capturing an image of the sheet 100a, the line sensor camera 121 is moved only by the image capture width that can be captured by the line sensor camera 121. As for the sheet 100b, the line sensor camera 121 captures an image of the image capture width region adjacent to the region corresponding to the image capture width region of the sheet 100a. Accordingly, the movement of the line sensor camera 121 can be reduced to the minimum amount, and the image capture error or the like caused by physical movement can also be reduced to the minimum amount.

Furthermore, tests to check the nth time printing are conducted on the first five sheets 100a through 100e, before the nth time printing on all the sheets 100a through 100h is completed, or before the nth time printing on the sheet 100h is completed. Accordingly, the test results can be certainly reflected in the (n+1)th time printing and the later printing.

Also, if a test result is not good, the printing by the printing device 110 is immediately stopped. Accordingly, the test result can be promptly reflected in the printing operation on the other sheets 100.

In the second embodiment, the test area that should be tested is the entire surface of each sheet 100. However, in a case where bumps are formed only on the center region of each sheet, the test area may be the center region of each sheet.

In the second embodiment, the printing device 110 and the testing device 120 receive and transmit test results via the system control device 140. However, the testing device 120 may send test results directly to the printing device 110.

(III) Third Embodiment

Figure 20:
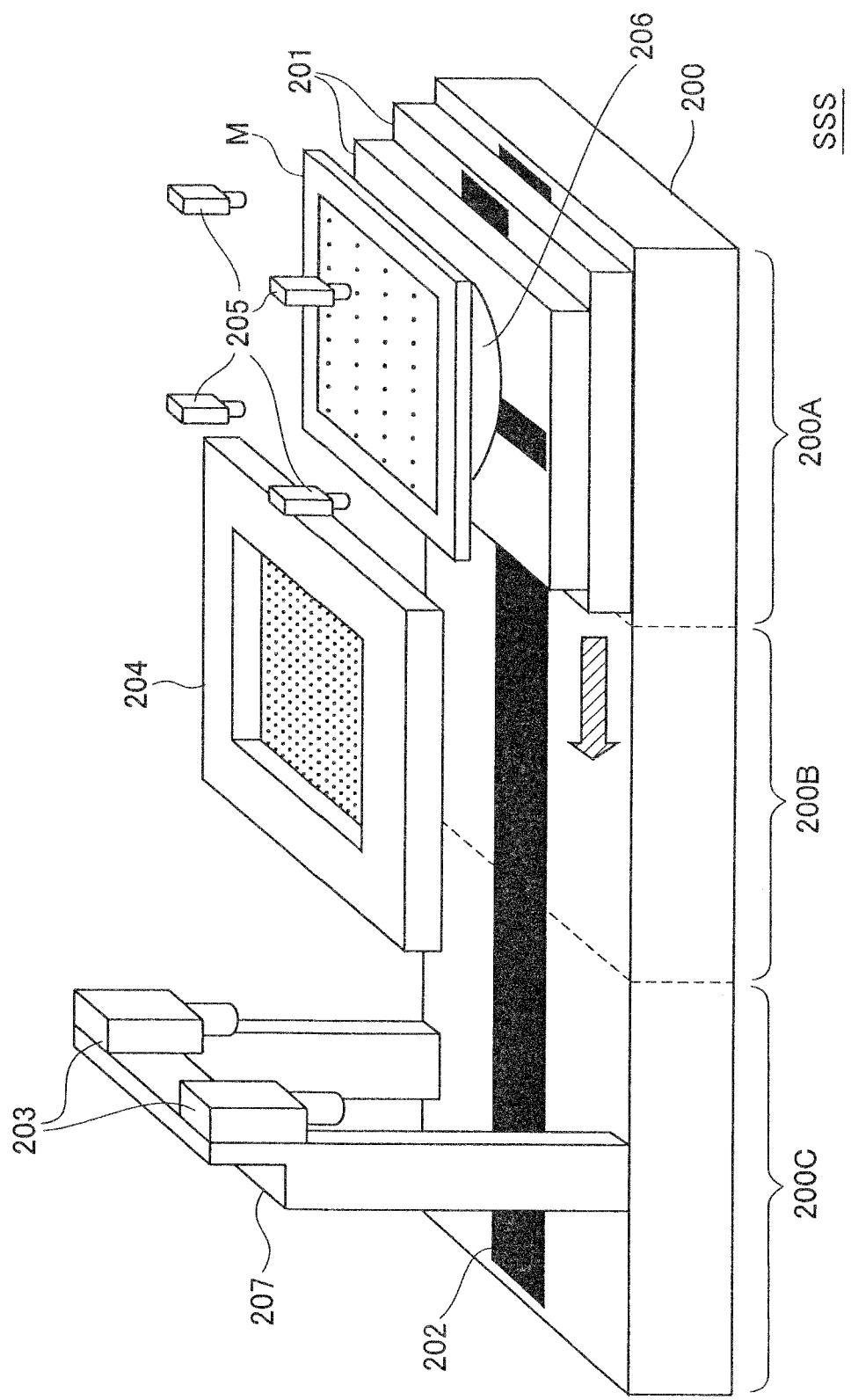
FIG. 20 is a block diagram schematically illustrating the structure of a manufacturing/testing device in accordance with a third embodiment of the present invention.

Referring now to FIG. 20, a third embodiment that is yet another preferred embodiment of the present invention is described. The third embodiment described below concerns a case where the present invention is applied in a manufacturing/testing device that manufactures stacked semiconductor substrates, and conducts an appearance tests to check the shapes or positions of the contact points or bumps formed on the surface of each of the manufactured semiconductor substrates, for example.

FIG. 20 is an external perspective view schematically illustrating the structure of the manufacturing/testing device in accordance with the third embodiment.

As shown in FIG. 20, the manufacturing/testing device SSS in accordance with the third embodiment is formed on a base 200. The manufacturing/testing device SSS is divided into three sections: a positioning section 200A that performs positioning (two-dimensional positioning) required when the contact points or bumps are formed on a substrate M as a material; a forming section 200B that forms the bumps and the likes on the substrate M by a printing technique after the positioning; and a testing section 200C that conducts an appearance test on the substrate M having the bumps and the likes formed thereon.

The positioning section 200A includes a biaxial table 201 as a two-dimensional positioning unit for performing the positioning, a rotating table 206 for performing positioning in a rotational direction, and a positioning camera 205 for checking the adjusted position of the substrate M with the use of an image.

The positioning in the X-direction and the Y-direction in the horizontal plane is performed by the biaxial table 201, and the positioning in the rotational direction is performed by the rotating table 206. With this configuration, the positions adjusted in each direction is artificially or automatically determined based on an image from the positioning camera 205. As the positioning is performed on the biaxial table 201 and the rotating table 206, the positioning between a transportation path 202 as a transporting unit and the substrate M is also performed.

The substrate M having its position adjusted, as well as the biaxial table 201 and the rotating table 206, are then transported on the transportation path 202 toward the left in FIG. 20, and arrives at the forming section 200B. Unlike a belt conveyor, the transportation path 202 can transport the substrate M to the forming section 200B and the testing section 200C, without disturbing the positions adjusted at the positioning section 200A.

By a printing technique using a screen printing plate 204 as a tool for manufacture, the contact points or bumps are formed on the substrate M transported to the forming section 200B. After this forming procedure, the substrate M remains on the rotating table 206, and is transported to the testing section 200C by the transportation path 202. The positions adjusted at the positioning section 200A are maintained, while the substrate M is transported to the testing section 200C.

At a supporting unit 207 as a supporting tool fixed to the base 200 at the testing section 200C, appearance testing cameras 203 as testing tools are provided so as to secure a field of view in which an appearance test can be conducted on the substrate M transported on the transportation path 202. With the use of the appearance testing cameras 203, an appearance test is conducted on the substrate M having the bumps and the likes formed thereon.

In this configuration, the appearance testing cameras 203 are formed with line sensor cameras or the likes that contain image pickup devices such as CCD. The appearance testing cameras 203 capture images of the appearances of the bumps formed at the forming section 200b, and transmit the results to a testing device or the like (not shown). When the appearance test is conducted, the substrate M (transported from the forming section 200B) is temporarily stopped at a predetermined testing position that is set within the field of view of the appearance testing cameras 203.

The position of the substrate M is adjusted at the positioning section 200A, and the substrate M is transported on the transportation path 202 while the adjusted position is maintained. Furthermore, like the positioning section 200A, the appearance testing cameras 203 are fixed onto the base 200 via the supporting unit 207. Accordingly, positioning is not necessary before an appearance test is conducted at the testing section 200C.

The testing section 200C may conduct an appearance test in each field of view of the respective appearance testing cameras 203, with the use of the appearance testing cameras 203 fixed to the supporting unit 207, as shown in FIG. 20. Alternatively, the testing section 200C may conduct an appearance test while performing scanning with the use of an appearance testing camera 203 that moves on rails formed on the supporting unit 207 in a direction (the depth direction in FIG. 20) that is perpendicular to the transporting direction of the substrate M, for example.

The substrate M having the appearance test conducted thereon at the testing section 200C is further transported to the next stage.

In a case where contact points or bumps are formed by a printing technique on a substrate like the substrate M in accordance with the third embodiment, more than one printing operation needs to be performed on the same substrate M. In such a case printing at the forming section 200B is repeatedly performed on the substrate M, as the substrate M is moved on the circulation-type transportation path. Every time a printing operation is performed, the positioning at the positioning section 200A, the printing at the forming section 200B, and the testing at the testing section 200C are performed. However, the position of the substrate M is adjusted only at once at the positioning section 200A, during at least one cycle of the positioning, printing, and testing.

As described above, in the manufacturing/testing device SSS in accordance with the third embodiment, the appearance testing cameras 203 are provided for examining the appearances of the bumps or the likes formed while the adjusted positions between the substrate M, the forming section B, and the transportation path 202 are maintained. The supporting unit 207 that supports the appearance testing cameras 203 is fixed onto the base 200, onto which the transportation path 202 is also fixed. Accordingly, a fixed positional relationship is maintained between the transportation path 202 for transporting the substrate M and the appearance testing camera 203. Thus, there is no need to perform positioning in any direction other than the transporting direction between the substrate M and the appearance testing camera 203 before an appearance test is conducted on the bumps or the likes.

Since the positioning before an appearance test is unnecessary, it is possible to avoid all disadvantages that can be caused by an extension of the manufacturing time, such as low efficiency, high production costs, and a large manpower requirement.

Also, even in the case where a test is conducted by moving an appearance testing camera 203 in a direction perpendicular to the direction in which the transportation path 202 transports the substrate M, there is no need to perform positioning in any direction other than the transporting direction between the substrate M and the appearance testing camera 203 before the appearance test is conducted.

Also in the case where the appearance testing cameras 203 are fixed onto the base 200, a fixed positional relationship is also maintained between the transportation path 202 for transporting the substrate M and the appearance testing cameras 203. Accordingly, there is no need to perform positioning in any direction other than the transporting direction between the substrate M and the appearance testing cameras 203 before an appearance test is conducted to check the bumps or the likes.

Furthermore, as the positioning is performed with the use of the biaxial table 201 and the rotating table 206, only the positioning in the transporting direction needs to be performed between the substrate M and the appearance testing camera 203 before an appearance test is conducted to check the bumps or the likes, and any other two-dimensional positioning is unnecessary.

In the third embodiment, the present invention is applied in the manufacturing/testing device that forms bumps or the likes on the substrate M. However, the present invention may be applied in various manufacturing/testing devices that involve appearance tests requiring positioning, such as a manufacturing/testing device that forms through holes for securing conduction between the layers in a stacked semiconductor substrate, for example.

INDUSTRIAL APPLICABILITY

As described so far, the present invention may be applied in the field of testing techniques involving appearance tests. Particularly, in the field of testing techniques for conducting tests while circulating materials through a plurality of stages, the present invention exhibits remarkable effects.

The invention claimed is:

1. A testing method for conducting a test on a plurality of sheet substrates having predetermined processing performed thereon, the testing method comprising:
   a processing step of repeatedly performing the predetermined processing on the sheet substrates N times (N being a natural number of 2 or larger) in a sequential manner, while the sheet substrates are being transported on a conveyor line; and
   a testing step of conducting a test on the first one of the sheet substrates among the plurality of the sheet substrates having the nth time processing (n being a natural number of N or smaller) first performed thereon, and returning the tested first sheet substrate to a spot behind one of the other sheet substrates having the nth time processing completed thereon,
   wherein the predetermined processing in the processing step is printing processing performed by repeatedly printing silver paste on the sheet substrates, to form bumps with a predetermined height on the sheet substrates, and
   wherein the testing step includes checking whether each of the bumps exists properly, has the predetermined height, and is located in a predetermined position.

2. The testing method according to claim 1, wherein the testing step includes returning the tested sheet substrate to a spot after the last sheet substrate having the nth time processing last performed thereon.

3. The testing method according to claim 1, wherein
the testing step includes a test result notifying step of notifying the processing step of a result of the test conducted on the sheet substrates having the nth time processing completed thereon; and
the processing step includes receiving the notification of the result of the test conducted to check the nth time processing from the testing step, and, when the test result is not good, stopping the processing being performed on the sheet substrates.

4. The testing method according to claim 1, wherein
the testing step includes a test result notifying step of notifying the processing step of a result of the test conducted on the sheet substrates having the nth time processing completed thereon; and
the processing step includes receiving the notification of the result of the test conducted to check the nth time processing from the testing step, and, only when the test result is good, performing the (n+1)th time processing on the sheet substrates.

5. A testing and processing system that performs predetermined processing and conducts a test on a plurality of sheet substrates being transported on a conveyor line, the testing and processing system comprising:
a processing device that repeatedly performs the predetermined processing on the sheet substrates N times (N being a natural number of 2 or larger) in a sequential manner, while the sheet substrates are being transported on the conveyor line; and
a testing device that conducts a test on the first one of the sheet substrates among the plurality of the sheet substrates having the nth time processing (n being a natural number of N or smaller) first performed thereon, and returns the tested first sheet substrate to a spot behind one of the other sheet substrates among the plurality of the sheet substrates having the nth time processing completed thereon,
wherein the predetermined processing in the processing device is printing processing performed by repeatedly printing silver paste on the sheet substrates, to form bumps with a predetermined height on the sheet substrates, and
wherein the testing device checks whether each of the bumps exists properly, has the predetermined height, and is located in a predetermined position.

6. The testing and processing system according to claim 5, wherein
the testing device returns the tested sheet substrate to a spot after the last sheet substrate having the nth time processing last performed thereon.

7. The testing and processing system according to claim 5, wherein
the testing device includes a test result notifying unit that notifies the processing device of a result of the test conducted on the sheet substrates having the nth time processing completed thereon; and
the processing device receives the notification of the result of the test conducted to check the nth time processing from the testing device, and, when the test result is not good, stops the processing being performed on the sheet substrates.

8. The testing and processing system according to claim 5, wherein
the testing device includes a test result notifying unit that notifies the processing device of a result of the test conducted on the sheet substrates having the nth time processing completed thereon; and
the processing device receives the notification of the result of the test conducted to check the nth time processing from the testing device, and, only when the test result is good, performs the (n+1)th time processing on the sheet substrates.

9. A processing device of a testing and processing system that performs predetermined processing and conducts a test on a plurality of sheet substrates being transported on a conveyor line, the testing and processing system comprising the processing device and a testing device,
the processing device configured to repeatedly perform the predetermined processing on the sheet substrates N times (N being a natural number of 2 or larger) in a sequential manner, while the sheet substrates are being transported on the conveyor line, and
the testing device configured to conduct a test on the first one of the sheet substrates among the plurality of the sheet substrates having the nth time processing (n being a natural number of N or smaller) first performed thereon, and returns the tested first sheet substrate to a spot behind one of the other sheet substrates among the plurality of the sheet substrates having the nth time processing completed thereon,
wherein the predetermined processing in the processing device is printing processing performed by repeatedly printing silver paste on the sheet substrates, to form bumps with a predetermined height on the sheet substrates, and
wherein the testing device checks whether each of the bumps exists properly, has the predetermined height, and is located in a predetermined position.

10. A testing device of a testing and processing system that performs predetermined processing and conducts a test on a plurality of sheet substrates being transported on a conveyor line, the testing and processing system comprising a processing device and the testing device,
the processing device configured to repeatedly perform the predetermined processing on the sheet substrates N times (N being a natural number of 2 or larger) in a sequential manner, while the sheet substrates are being transported on the conveyor line, and
the testing device configured to conduct a test on the first one of the sheet substrates among the plurality of the sheet substrates having the nth time processing (n being a natural number of N or smaller) first performed thereon, and returning the tested first sheet substrate to a spot behind one of the other sheet substrates among the plurality of the sheet substrates having the nth time processing completed thereon,
wherein the predetermined processing in the processing device is printing processing performed by repeatedly printing silver paste on the sheet substrates, to form bumps with a predetermined height on the sheet substrates, and
wherein the testing device checks whether each of the bumps exists properly, has the predetermined height, and is located in a predetermined position.

* * * * *

UNITED STATES PATENT AND TRADEMARK OFFICE
CERTIFICATE OF CORRECTION

PATENT NO.       : 8,358,339 B2                                           Page 1 of 1
APPLICATION NO.  : 12/373350
DATED            : January 22, 2013
INVENTOR(S)      : Kenta Hayashi It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1033 days.

Signed and Sealed this
First Day of September, 2015

Michelle K. Lee
*Director of the United States Patent and Trademark Office*